United States Patent
Kim

(10) Patent No.: US 8,106,716 B2
(45) Date of Patent: Jan. 31, 2012

(54) OSCILLATOR, OSCILLATOR IMPLEMENTATIONS AND METHOD OF GENERATING AN OSCILLATING SIGNAL

(75) Inventor: Chan-kyung Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 94 days.

(21) Appl. No.: 12/320,623

(22) Filed: Jan. 30, 2009

(65) Prior Publication Data

US 2010/0073097 A1    Mar. 25, 2010

(30) Foreign Application Priority Data

Sep. 19, 2008    (KR) .................. 10-2008-0092419

(51) Int. Cl.
*H03K 3/03* (2006.01)
(52) U.S. Cl. .......................................... 331/57; 331/186
(58) Field of Classification Search .................. 331/57, 331/185, 186
See application file for complete search history.

(56) References Cited

U.S. PATENT DOCUMENTS

| | | | |
|---|---|---|---|
| 6,469,585 B1 * | 10/2002 | Dai et al. | 331/57 |
| 7,383,033 B2 | 6/2008 | Holger | |
| 7,391,276 B2 * | 6/2008 | Sakaguchi | 331/57 |
| 2007/0077905 A1 | 4/2007 | Oh et al. | |
| 2007/0082640 A1 | 4/2007 | Kim | |

OTHER PUBLICATIONS

Kyu-hyoun Kim et al., "A 20-Gb/s 256-Mb DRAM With an Inductorless Quadrature PLL and a Cascaded Pre-emphasis Transmitter" IEEE Journal of Solid-State Circuits, vol. 41, No. 1, Jan. 2006.

* cited by examiner

*Primary Examiner* — Robert Pascal
*Assistant Examiner* — James Goodley
(74) *Attorney, Agent, or Firm* — Harness, Dickey & Pierce, P.L.C.

(57) ABSTRACT

One embodiment of the oscillator includes a first starved inverter and a second starved inverter. An inner inverter of the second starved inverter is cross-coupled to an inner inverter of the first starved inverter. The oscillator further includes a first inverter connected to output of the inner inverter of the first starved inverter, and a second inverter connected to output of the inner inverter of the second starved inverter.

19 Claims, 29 Drawing Sheets

OSCILLATOR, OSCILLATOR IMPLEMENTATIONS AND METHOD OF GENERATING AN OSCILLATING SIGNAL

PRIORITY INFORMATION

The subject application claims priority under 35 U.S.C. 119 on Korean application no. 10-2008-0092419 filed Sep. 19, 2008; the contents of which are hereby incorporated by reference in their entirety.

FIELD OF THE INVENTION

Embodiments relate to oscillators and semiconductor devices having a oscillators. For example, oscillators may be used to generate clock signals in semiconductor circuits. Phase lock loop (PLL) circuits include oscillators to align data and clocks. Synchronous DRAM, graphics DRAM, chips for communication systems, etc. use phase lock loop clock generators.

SUMMARY OF THE INVENTION

Embodiments relates to oscillators and/or semiconductor memory devices including oscillators.

In one embodiment, the oscillator includes a first starved inverter and a second starved inverter. An inner inverter of the second starved inverter is cross-coupled to an inner inverter of the first starved inverter. The oscillator further includes a first inverter connected to output of the inner inverter of the first starved inverter, and a second inverter connected to output of the inner inverter of the second starved inverter.

In another embodiment, the oscillator includes a first and a second stage. The first stage includes at least a pair of cross-coupled inverters, and the second stage includes at least one inverter inverting output of one of the cross-coupled inverters.

In yet another embodiment, the oscillator includes first-fourth transistors connected in series. The first and second transistors are of a first type, and the third and fourth transistors are of a second type. A connection of the first and second transistors is a first node, a connection of the second and third transistors is a second node, and a connection of the third and fourth transistors is a third node. The oscillator further includes fifth-eighth transistors connected in series. The fifth and sixth transistors are of the first type, and the seventh and eighth transistors are of the second type. A connection of the fifth and sixth transistors is a fourth node, a connection of the sixth and seventh transistors is a fifth node, and a connection of the seventh and eighth transistors is a sixth node. Gates of the sixth and seventh transistors are connected to the second node, and the fifth node is connected to gates of the second and third transistors. The oscillator still further includes a first inverter and a second inverter. An input of the first inverter is connected to the second node. An output of the first inverter is connected to the first node, the third node, a gate of the fifth transistor and a gate of the eighth transistor. An input of the second inverter is connected to the fifth node. An output of the second inverter is connected to the fourth node, the sixth node, a gate of the first transistor and a gate of the fourth transistor.

Yet another embodiment of the oscillator includes a first oscillator circuit and a second oscillator circuit. The first oscillator circuit includes a first starved inverter and a second starved inverter. An inner inverter of the second starved inverter is cross-coupled to an inner inverter of the first starved inverter. The first oscillator circuit further includes a first inverter and a second inverter. The first inverter has an input connected to output of the inner inverter of the first starved inverter, and the second inverter has an input connected to output of the inner inverter of the second starved inverter. The second oscillator circuit includes a third starved inverter and a fourth starved inverter. The third starved inverter is connected to an output of the first inverter. An inner inverter of the fourth starved inverter is cross-coupled to an inner inverter of the third starved inverter, and the fourth starved inverter is connected to the second inverter. The second oscillator circuit also includes a third inverter and a fourth inverter. The third inverter has an input connected to output of the inner inverter of the third starved inverter and has an output connected to the second starved inverter. The fourth inverter has an input connected to output of the inner inverter of the fourth starved inverter and has an output connected to the first starved inverter.

A further embodiment of an oscillator includes a first oscillating circuit and second oscillating circuit. The first oscillating circuit includes a first and a second stage. The first stage includes at least a pair of cross-coupled inverters. The second stage includes at least one inverter connected to an output of one of the cross-coupled inverters. The second oscillating circuit includes a third and fourth stage. The third stage includes at least a pair of cross-coupled inverters, and receives output from the inverter of the second stage. The fourth stage includes at least one inverter connected to an output of one of the cross-coupled inverters, and supplies output to the first stage.

A still further embodiment of an oscillator includes a first oscillator circuit and a second oscillator circuit. The first oscillator circuit includes first-fourth transistors connected in series. The first and second transistors are of a first type, and the third and fourth transistors are of a second type. A connection of the first and second transistors is a first node, a connection of the second and third transistors is a second node, and a connection of the third and fourth transistors is a third node. The first oscillator circuit further includes fifth-eighth transistors connected in series. The fifth and sixth transistors are of the first type, and the seventh and eighth transistors are of the second type. A connection of the fifth and sixth transistors is a fourth node, a connection of the sixth and seventh transistors is a fifth node, and a connection of the seventh and eighth transistors is a sixth node. An input of the first inverter is connected to the second node, a gate of the sixth transistor and a gate of the seventh transistor. An input of the second inverter is connected to the fifth node, a gate of the second transistor and a gate of the third transistor.

The second oscillator circuit includes ninth-twelfth transistors connected in series. The ninth and tenth transistors are of a first type, and the eleventh and twelfth transistors are of a second type. A connection of the ninth and tenth transistors is a seventh node, a connection of the tenth and eleventh transistors is a eighth node, and a connection of the eleventh and twelfth transistors is a ninth node. The second oscillator circuit further includes thirteenth-sixteenth transistors connected in series. The thirteenth and fourteenth transistors are of the first type, and the fifteenth and sixteenth transistors are of the second type. A connection of the thirteenth and fourteenth transistors is a tenth node, a connection of the fourteenth and fifteenth transistors is an eleventh node, and a connection of the fifteenth and sixteenth transistors is a twelfth node. An input of the third inverter is connected to the eighth node, a gate of the fourteenth transistor and a gate of the fifteenth transistor. An output of the third inverter is connected to the fourth node, the sixth node, a gate of the first transistor and a gate of the fourth transistor. An input of the fourth inverter is connected to the eleventh node, a gate of the tenth transistor and a gate of the eleventh transistor. An output of the fourth inverter is connected to the third node, the first node, a gate of the fifth transistor and a gate of the eighth transistor. An output of the first inverter is connected to the seventh node, the ninth node, a gate of the thirteenth transistor and a gate of the sixteenth transistor. An output of the second inverter is connected to the tenth node, the twelfth node, the gate of the ninth transistor and the gate of the twelfth transistor.

As stated above, embodiments further relates to semiconductor devices including an oscillator. For example, the semiconductor device may be a phased-lock loop circuit, and/or a device including a phased-locked loop circuit. As another example, the semiconductor device may be a memory where the oscillator generates a clock signal of the memory.

Embodiments further relates to methods of generating a oscillating signal.

One embodiment of the method includes selectively leaking current to an input of a first inverter of a cross-coupled pair of inverters and selectively leaking current from an input of a second inverter of the cross-coupled pair of inverters. The method may further include inverting output of one of the first and second inverters.

BRIEF DESCRIPTION OF THE DRAWINGS

The embodiments will become more fully understood from the detailed description given herein below and the accompanying drawings, wherein like elements are represented by like reference numerals, which are given by way of illustration only and thus are not limiting of the present invention and wherein.

DETAILED DESCRIPTION OF EMBODIMENTS

Figure 1:
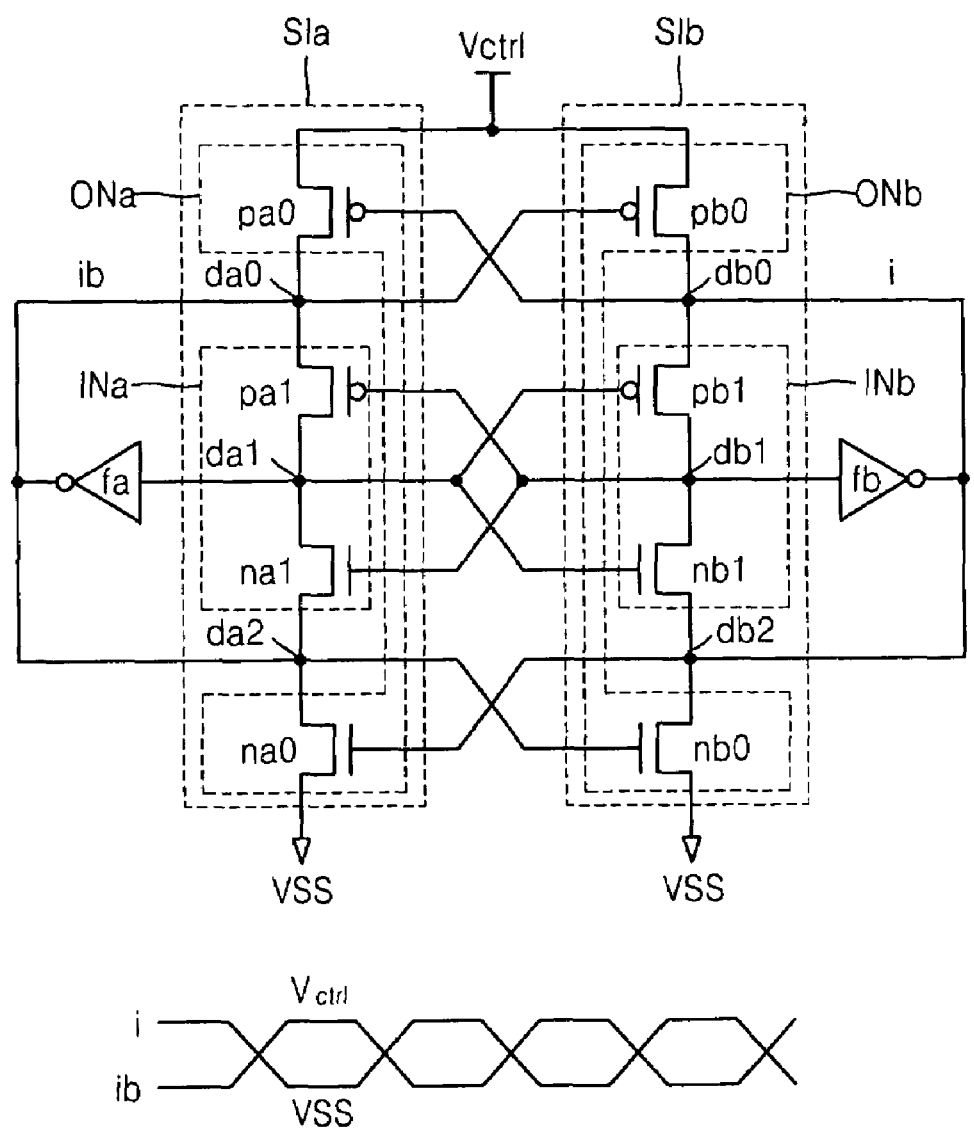
FIG. 1 illustrates an oscillator according to an embodiment.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates an oscillator according to an embodiment. As shown, the oscillator includes first-fourth PMOS transistors pa0, pa1, pb0, pb1 and first-fourth NMOS transistors na0, na1, nb0, nb1. The first PMOS transistor pa0, the second PMOS transistor pa1, the second NMOS transistor na1 and the first NMOS transistor na0 are connected in series between a control voltage Vctrl and ground VSS. The third PMOS transistor pb0, fourth PMOS transistor pb1, the fourth NMOS transistor nb1, and the third NMOS transistor nb0 are connected in series between the control voltage Vctrl and ground VSS. For ease of description, the connection between the first and second PMOS transistors pa0 and pa1 is a first node da0, the connection between the second PMOS transistor pa1 and the second NMOS transistor na1 is a second node da1, and the connection between the second NMOS transistor na1 and the first NMOS transistor na0 is a third node da2. Similarly, the connection between the third and fourth PMOS transistors is a fourth node db0, the connection between the fourth PMOS transistor pb1 and the fourth NMOS transistor nb1 is a fifth node db1, and the connection between the fourth and third NMOS transistors nb1 and nb0 is a sixth node db2.

A gate of the first PMOS transistor pa0 is connected to the fourth node db0, a gate of the second PMOS transistor pa1 is connected to the fifth node db1, a gate of the second NMOS transistor na1 is connected to the fifth node db1, and a gate of the first NMOS transistor na0 is connected to the sixth node db2. Similarly, a gate of the third PMOS transistor pb0 is connected to the first node da0, a gate of the fourth PMOS transistor pb1 is connected to the second node da1, a gate of the fourth NMOS transistor nb1 is connected to the second node da1, and a gate of the third NMOS transistor nb0 is connected to the third node da2.

The oscillator of FIG. 1 further includes first and second inverters fa and fb. The first inverter fa has an input connected to the second node da1 and has an output connected to the first and third nodes da0 and da2. The second inverter fb has an input connected to the fifth node db1 and has an output connected to the fourth and sixth nodes db0 and db2.

As will be appreciated, the first PMOS transistor pa0, the second PMOS transistor pa1, the second NMOS transistor na1 and the first NMOS transistor na0 form a first starved inverter SIa. In the first starved inverter SIa, the second PMOS and NMOS transistors pa1 and na1 form a first inner inverter INa while the first PMOS and NMOS transistors pa0 and na0 form an outer inverter ONa. Similarly, the third PMOS transistor pb0, fourth PMOS transistor pb1, the fourth NMOS transistor nb1, and the third NMOS transistor nb0 form a second starved inverter SIb. In the second starved inverter SIb, the fourth PMOS and NMOS transistors pb1 and nb1 form a second inner inverter INb while the third PMOS and NMOS transistors pb0 and nb0 form an outer inverter ONb.

As shown in FIG. 1, the input of the first inner inverter INa is connected to the output of the second inner invert INb, and the output of the first inner inverter INa is connected to the input of the second inner inverter INb. Namely, the first and second inner inverters INa and INb are cross-coupled.

The output of the first inner inverter INa is also connected to the input of the first inverter fa, and the output of the second inner inverter INb is also connected to the input of the second inverter fb. Furthermore, the output of the second inverter fb is feed back to the input of the first outer inverter ONa, and the output of the first inverter fa is feed back to the input of the second outer inverter ONb. Accordingly, the first and second starved inverters SIa and SIb may be viewed as a first stage, and the first and second inverters fa and fb may be viewed as a second stage, which provides feedback to the first stage. Also of note, neither stage includes inductors.

In the embodiment of FIG. 1, the output of second inverter fb provides the oscillation signal i, while the output of the first inverter fa provides the inverse of the oscillation signal ib.

Next, operation of the oscillator of FIG. 1 will be described in detail with respect to FIGS. 2 and 3. For purposes of description only, assume that the second node da1 is at a low enough voltage L that the first inverter fa outputs a logic high voltage, and assume that the fifth node db1 is at a high enough voltage H that the second inverter fb outputs a logic low voltage. Namely, the low voltage L is not a full logic low voltage, and the high voltage H is not a full logic high voltage. Instead the low voltage L is below, but near the low trip point of the first inverter fa such that the first inverter fa inverts the low voltage L to a high voltage. The high voltage H is above, but near the high trip point of the second inverter fb such that the second inverter fb inverts the high voltage H to a low voltage. In one embodiment, the first and second inverters fa and fb have substantially the same low trip points and substantially the same high trip points.

The first inverter fa inverts the low voltage L to produce a high voltage. Accordingly, a high voltage is applied to the gates of the third PMOS transistor pb0 and the third NMOS transistor nb0, which turns the third PMOS transistor pb0 off and turns the third NMOS transistor nb0 on, as shown in FIG. 2. The second inverter fb inverts the high voltage H to produce a low voltage. Accordingly, a low voltage is applied to the gates of the first PMOS transistor pa0 and the first NMOS transistor na0, which turns the first PMOS transistor pa0 on and the first NMOS transistor na0 off, as shown in FIG. 2.

The high voltage H is low enough that the second PMOS transistor pa1 slightly turns on and current leaks through the second PMOS transistor pa1 from the turned on first PMOS transistor pa0. Namely, the high voltage H is applied to the input of the first inner inverter INa, and causes current to leak into the first inner inverter INa. The low voltage L is high enough that the fourth NMOS transistor nb1 slightly turns on and current leaks through the fourth NMOS transistor nb1 and onto ground via the turned on third NMOS transistor nb0. Namely, the low voltage is applied to the input of the second inner inverter INb, and causes current to leak from the second inner inverter INb.

The current leaking through the second PMOS transistor pa1 builds up at second node da1 such that the second node da1 rises to the high voltage H. This trips the first inverter fa to invert the high voltage H and output a low voltage. The current leaking through the fourth NMOS transistor nb1 pulls the voltage at the fifth node db1 down such that the fifth node db1 drops to the low voltage L. This trips the second inverter fb to invert the low voltage L and outputs a high voltage. Accordingly, the first stage is configured such that current leaks to the input of the second inner inverter INb and the input of the first inverter fa, while current leaks from the input of the first inner inverter INa and the input of the second inverter fb. Also, while current leaks to the inputs of the second inner inverter INb and first inverter fa, current is not leaked from the inputs of the second inner inverter INb and the first inverter fa. Similarly, while current leaks from the inputs of the first inner inverter INa and the second inverter fb, current does not leak to the inputs of the first inner inverter INa and the second inverter fb.

Figure 3:
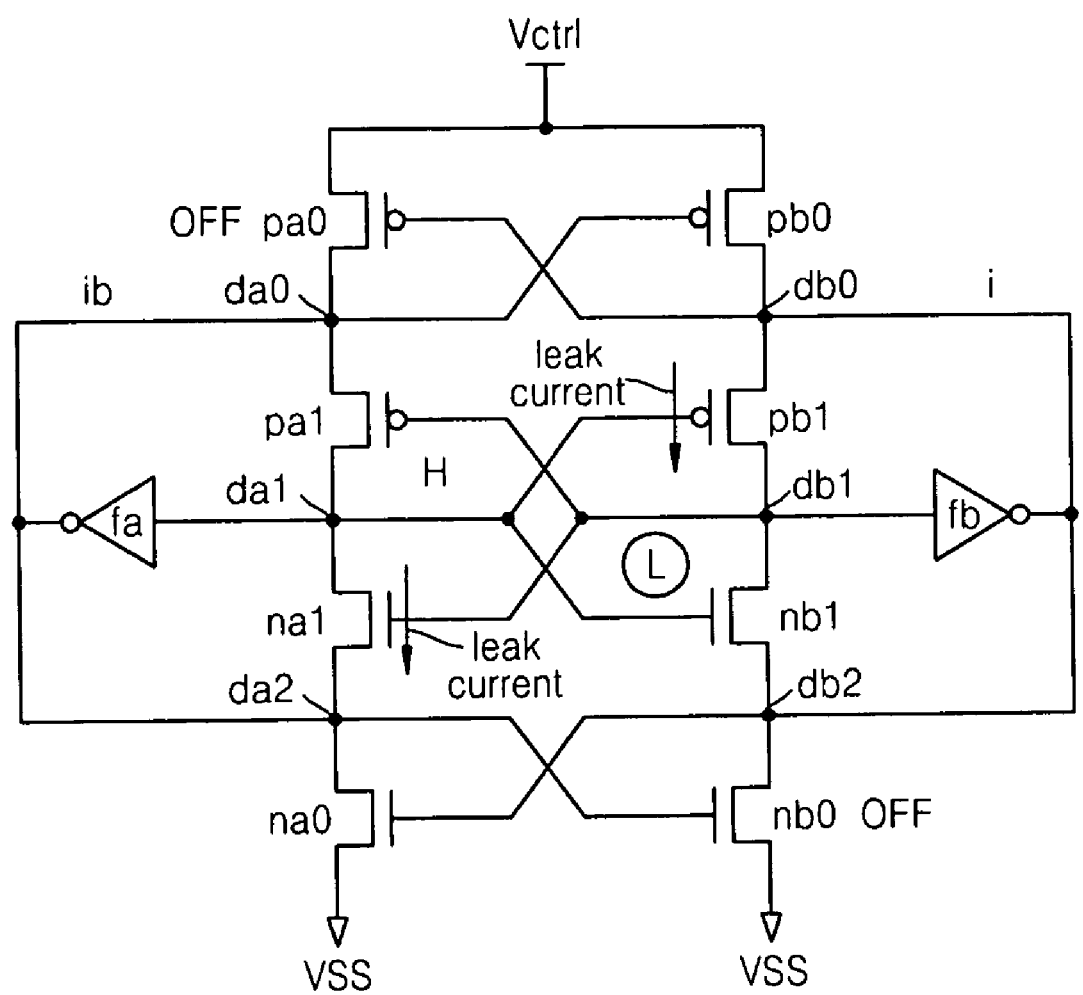

This operation results in the state shown in FIG. 3. As shown, the second node da1 is at the high enough voltage H that the first inverter fa outputs a logic low voltage, and the fifth node db2 is at the low enough voltage L that the second inverter fb outputs a logic high voltage. As before, the low voltage L is not a full logic low voltage, and the high voltage H is not a full logic high voltage. Instead the low voltage L is below, but near the low trip point of the second inverter fb such that the second inverter fb inverts the low voltage L to a high voltage. The high voltage H is above, but near the high trip point of the first inverter fa such that the first inverter fa inverts the high voltage H to a low voltage.

With the first inverter fa inverting the high voltage H to produce a low voltage, a low voltage is applied to the gates of the third PMOS transistor pb0 and the third NMOS transistor nb0, which turns the third PMOS transistor pb0 on and turns the third NMOS transistor nb0 off, as shown in FIG. 3. The second inverter fb inverts the low voltage L to produce a high voltage. Accordingly, a high voltage is applied to the gates of the first PMOS transistor pa0 and the first NMOS transistor na0, which turns the first PMOS transistor pa0 off and the first NMOS transistor na0 on, as shown in FIG. 3.

The high voltage H is low enough that the fourth PMOS transistor pb1 slightly turns on and current leaks through the fourth PMOS transistor pb1 from the turned on third PMOS transistor pb0. Namely, the high voltage H is applied to the input of the second inner inverter INb, and causes current to leak into the second inner inverter INb. The low voltage L is high enough that the second NMOS transistor na1 slightly turns on and current leaks through the second NMOS transistor na1 and onto ground via the turned on first NMOS transistor na0. Namely, the low voltage is applied to the input of the first inner inverter INa, and causes current to leak from the first inner inverter INa.

The current leaking through the fourth PMOS transistor pb1 builds up at the fifth node db1 such that the fifth node db1 rises to the high voltage H. This trips the second inverter fb to invert the high voltage H and output a low voltage. The current leaking through the second NMOS transistor na1 pulls the voltage at the second node da1 down such that the second node da1 drops to the low voltage L. This trips the first inverter fa to invert the low voltage L and outputs a high voltage. Accordingly, the first stage is configured such that current leaks to the input of the first inner inverter INa and the input of the second inverter fb, while current leaks from the input of the second inner inverter INb and the input of the first inverter fa. Also, while current leaks to the inputs of the first inner inverter INa and the second inverter fb, current is not leaked from the inputs of the first inner inverter INa and the second inverter fb. Similarly, while current leaks from the inputs of the second inner inverter INb and the first inverter fa, current does not leak to the inputs of the second inner inverter INb and the first inverter fa.

Figure 2:
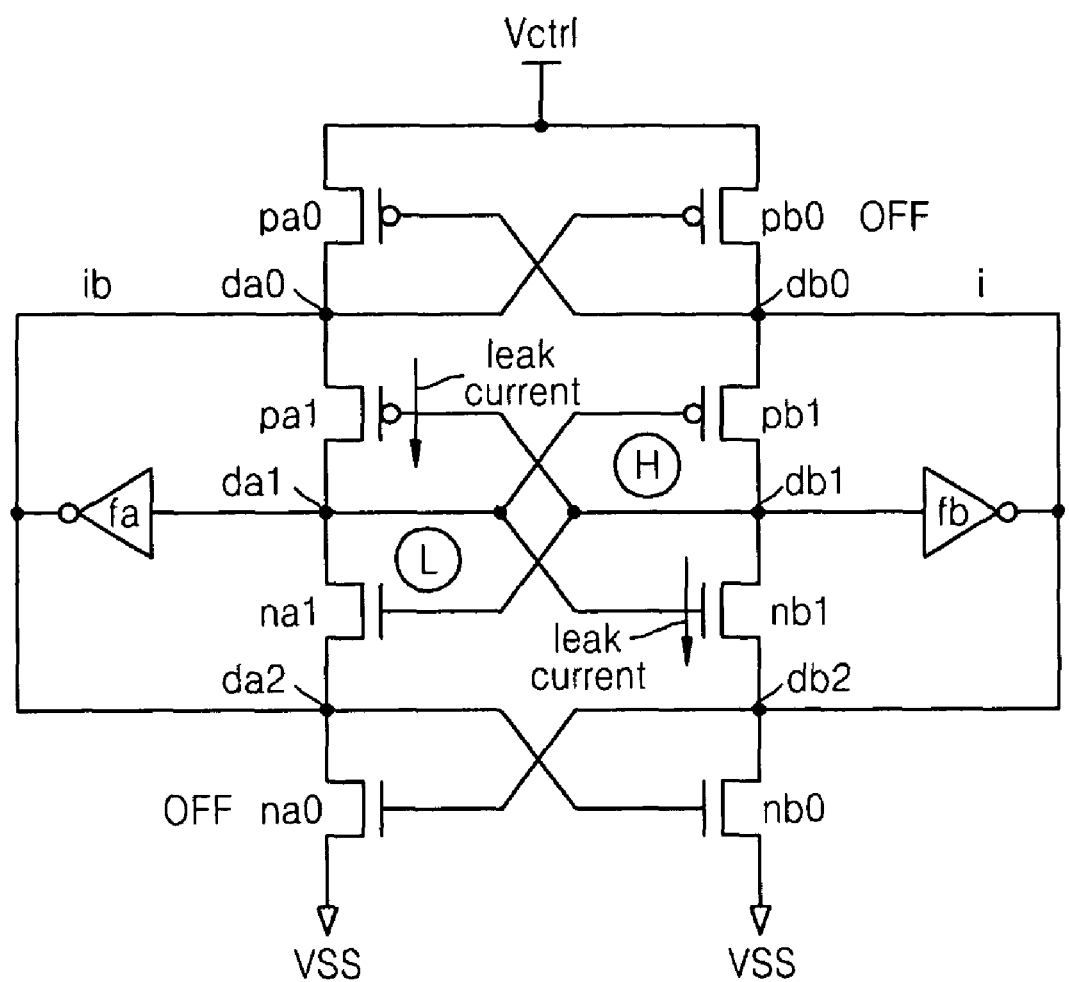
FIGS. 2-3 illustrate operation of the oscillator in FIG. 1.

As a result the state shown in FIG. 2 is achieved. The operations described above with respect to FIGS. 2 and 3 repeat such that the first and second inverters fa and fb each generate oscillating signals ib and i, respectively, which are 180 degrees out-of-phase with one another. The oscillating signal i and ib are shown in FIG. 1.

Figure 4:
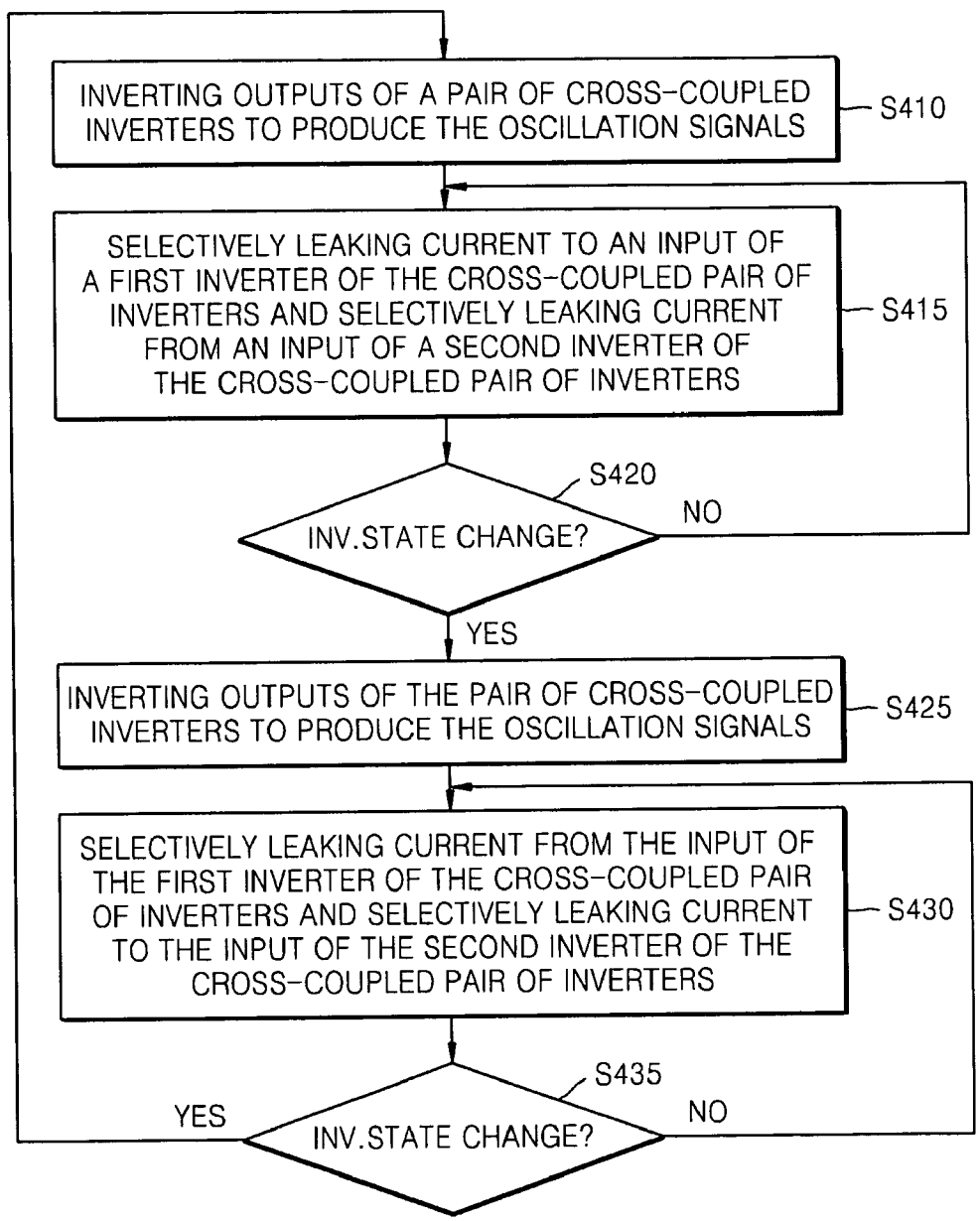
FIG. 4 illustrates a flow chart for conceptually describing a method of generating oscillating signals according to the embodiment of FIG. 1.

FIG. 4 illustrates a flow chart for conceptually describing a method of generating oscillating signals according to the embodiment of FIG. 1. As shown, and with reference to FIG. 1 as well, in step S410, the outputs of the first and second inner inverters INa and INb, which are cross-coupled, are inverted by the first and second inverters fa and fb, respectively, to produce the oscillation signals ib and i. In step S415, the first stage leaks current to the input of one of the first and second inner inverters INa and INb, while leaking current from the input of the other one of the first and second inner inverters INa and INb. For example, as shown in FIG. 2, current may leak to the input of the second inner inverter INb while current leaks from the input of the first inner inverter INa. The leaking of current in step S415 occurs until the cross-coupled inverters INa and INb change their respective inversion states as shown by step S420.

If the cross-coupled inverters INa and INb change their respective inversion states (e.g., are tripped), then the outputs of the cross-coupled inverters INa and INb are inverted by the first and second inverters fa and fb to produce the oscillation signals ib and i in step S425. Namely, once the cross-coupled inverters INa and INb change state, then the oscillation signals change state.

Next, in step S430, the first stage leaks current to the input of an opposite one the first and second inner inverters INa and INb as compared to step S415, while leaking current from the input of the other one of the first and second inner inverters INa and INb. For example, as shown in FIG. 3, current may leak to the input of the first inner inverter INa while current leaks from the input of the second inner inverter INb. The leaking of current in step S430 occurs until the cross-coupled inverters INa and INb change their respective inversion states as shown by step S435.

If the cross-coupled inverters INa and INb change their respective inversion states (e.g., are tripped), then the outputs of the cross-coupled inverters INa and INb are inverted by the first and second inverters fa and fb to produce the oscillation signals ib and i in step S410. Namely, the once the cross-coupled inverters INa and INb change state, then the oscillation signals change state, and the process repeats starting at step S410.

Figure 5:
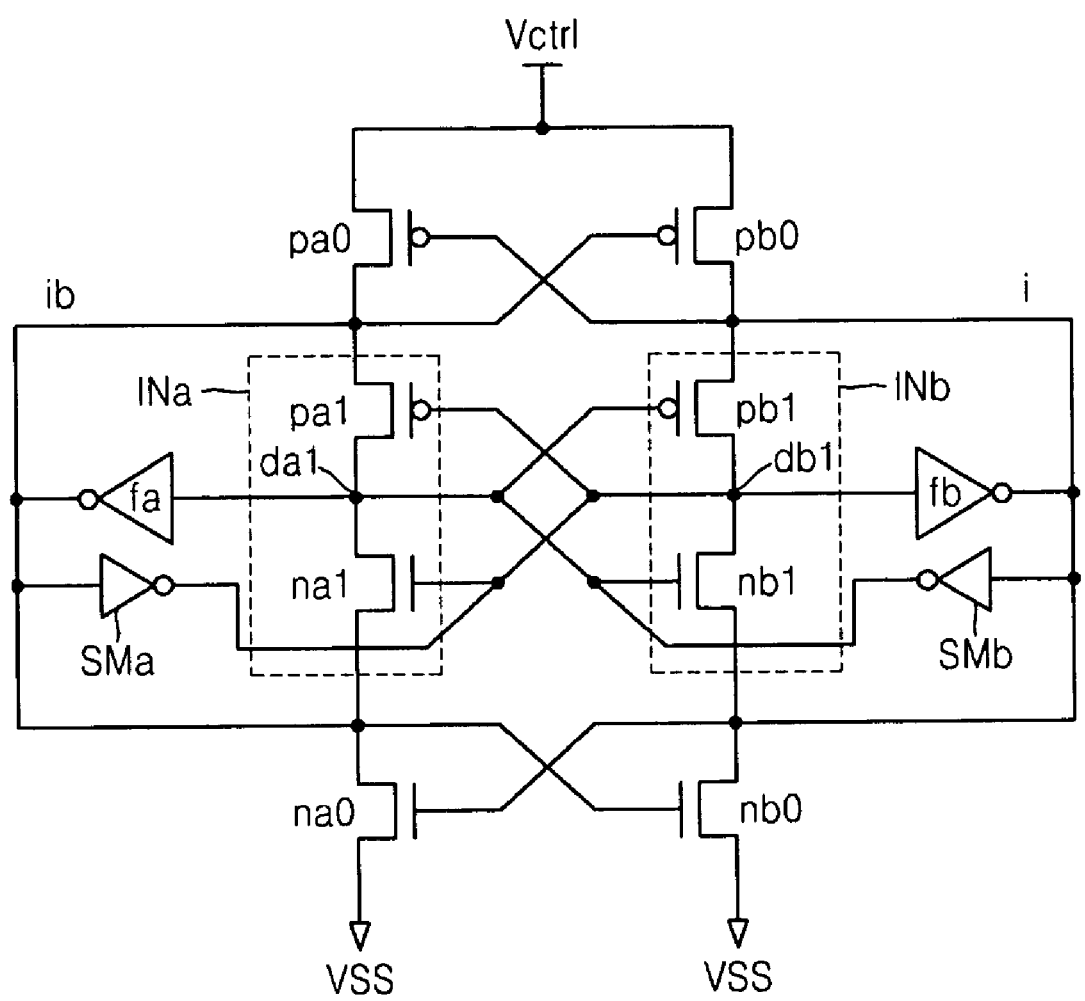
FIGS. 5-8 each illustrate an oscillator according to another embodiment.

FIG. 5 illustrates another embodiment of an oscillator. This embodiment is the same as the embodiment of FIG. 1 except that the embodiment of FIG. 5 includes first and second smaller inverters SMa and SMb. The first and second smaller inverters SMa and SMb have a smaller size than the first and second inverters fa and fb. In one embodiment, the transistors forming the first and second smaller inverters SMa and SMb are the smallest size permitted by the processing technology used to create the oscillator. As will be appreciated, the size of the other inverters depends on the application, desired operation frequency, etc. of the oscillator; namely, is a design constraint.

As shown, the first smaller inverter SMa is connected between the output of the first inverter fa and the fifth node db1. Namely, the first smaller inverter SMa inverts the output of the first inverter fa, and supplies the inverted output to the inputs of the first inner inverter INa and the second inverter fb. Similarly, the second smaller inverter SMb is connected between the output of the second inverter fb and the second node da1. Namely, the second smaller inverter SMb inverts the output of the second inverter fb, and supplies the inverted output to the inputs of the second inner inverter INb and the first inverter fa.

The first and second smaller inverters SMa and SMb create additional current paths for changing the inversion state of the cross-coupled inverters INa and INb as well as the first and second inverters fa and fb. As such, the first and second smaller inverters SMa and SMb may be thought of as part of the second stage along with the first and second inverters fa and fb, and the addition of the first and second smaller inverters SMa and SMb increases the maximum frequency of the oscillation signals ib and i.

Figure 6:
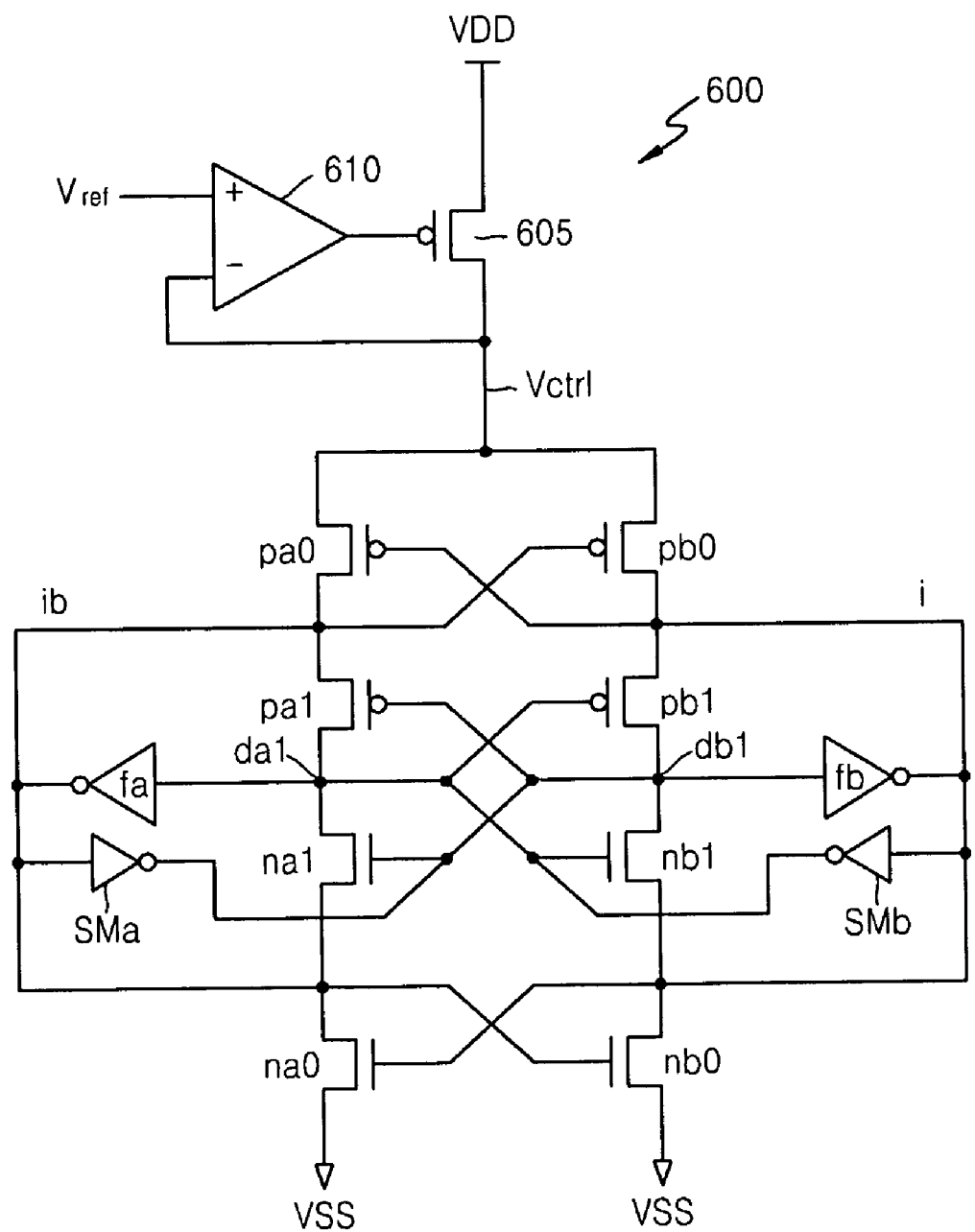

FIG. 6 illustrates the embodiment of FIG. 5 connected to a control voltage generating circuit. It will be appreciated that the embodiment of FIG. 5 has been shown in conjunction with the control voltage generating circuit 600 merely as an example, and that application of this control voltage generating circuit 600 is not limited to the embodiment of FIG. 5. For example, the control voltage generating circuit 600 may be connected to the embodiment of FIG. 1.

As shown, the control voltage generating circuit 600 includes a PMOS transistor 605 connected between a supply voltage VDD and the first and third PMOS transistors pa0 and pb0 of FIG. 5. An operational amplifier 610 has its output connected to the gate of the PMOS transistor 605. The non-inverting input of the operational amplifier 610 receives a reference voltage Vref, and the inverting input of the operational amplifier 610 receives the control voltage Vctrl supplied by the PMOS transistor 605 to the oscillator of FIG. 5. By changing the reference voltage Vref, the control voltage Vctrl changes. Namely, the control voltage Vctrl may be controlled by controlling the reference voltage Vref. The control voltage Vctrl affects the frequency of the oscillation signals i and ib produced by the oscillator. As the control voltage Vctrl increases, the frequency of the oscillation signals i and ib increase. As will be appreciated, a maximum value of the control voltage Vctrl is limited to the power supply voltage VDD.

Figure 7:
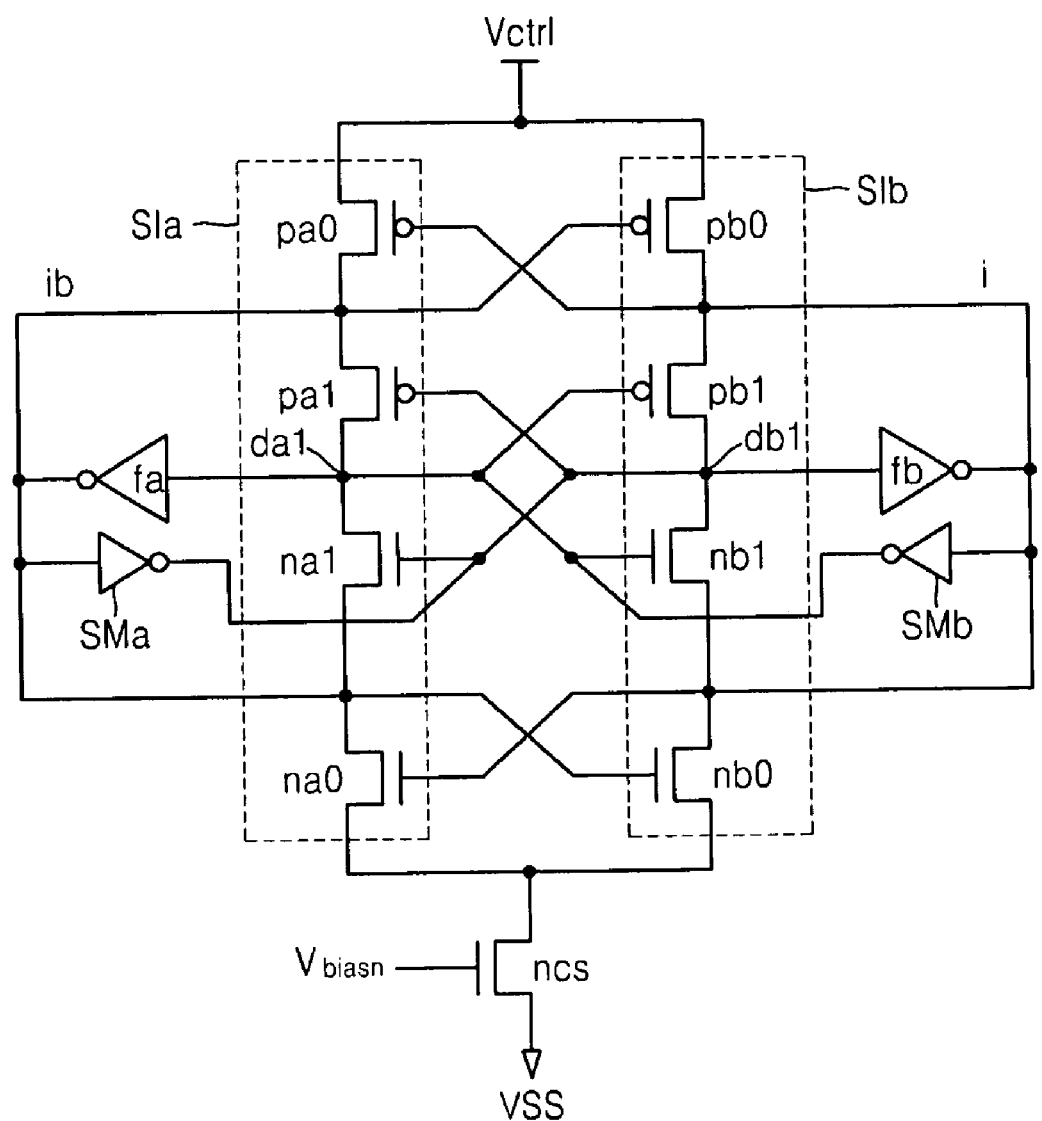

FIG. 7 illustrates another embodiment of an oscillator. This embodiment is the same as the embodiment of FIG. 5 except that the first and second starved inverters SIa and SIb are connected to an NMOS transistor ncs instead of ground VSS. The NMOS transistor ncs is connected between ground VSS and the first and third NMOS transistors na0 and nb0. The NMOS transistor ncs receives a control bias vbiasn at its gate. The control bias vbiasn controls the voltage level at the drains of the first and third NMOS transistors na0 and nb0. Changing this voltage level changes the frequency of the oscillation signals i and ib produced by the oscillator. Namely, as the bias vbiasn increases, the frequency of the oscillation signals i and ib increases.

Figure 8:
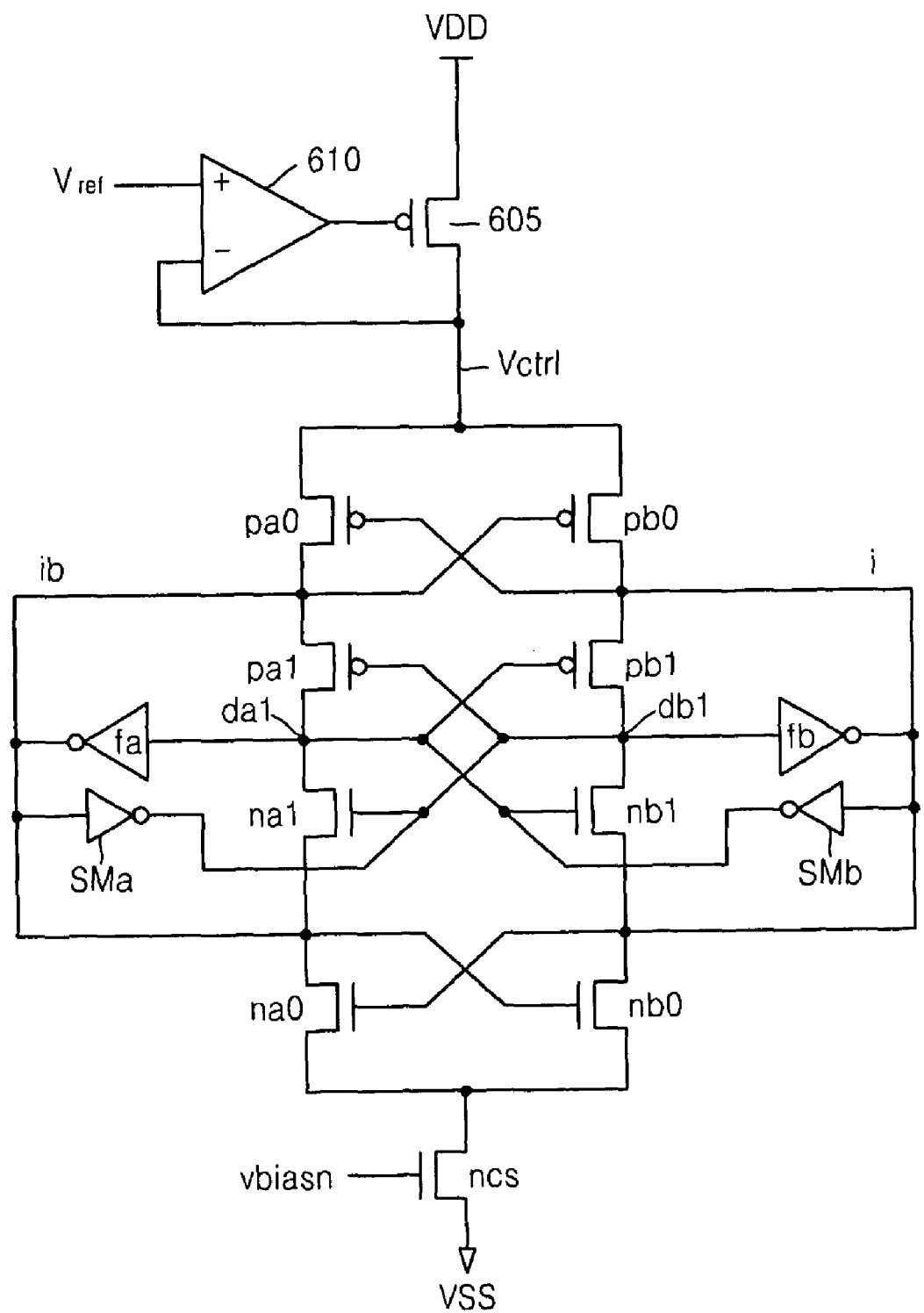

FIG. 8 illustrates another embodiment of an oscillator. This embodiment is the same as the embodiment of FIG. 6 except the NMOS transistor ncs of the embodiment of FIG. 7 has been added. Accordingly, the frequency of the oscillation signals i and ib may be controlled by controlling the control voltage Vctrl as described with respect to FIG. 6, by controlling the control bias Vbiasn as described with respect to FIG. 7, or by controlling both the control voltage Vctrl and the control bias Vbiasn.

Figure 9:
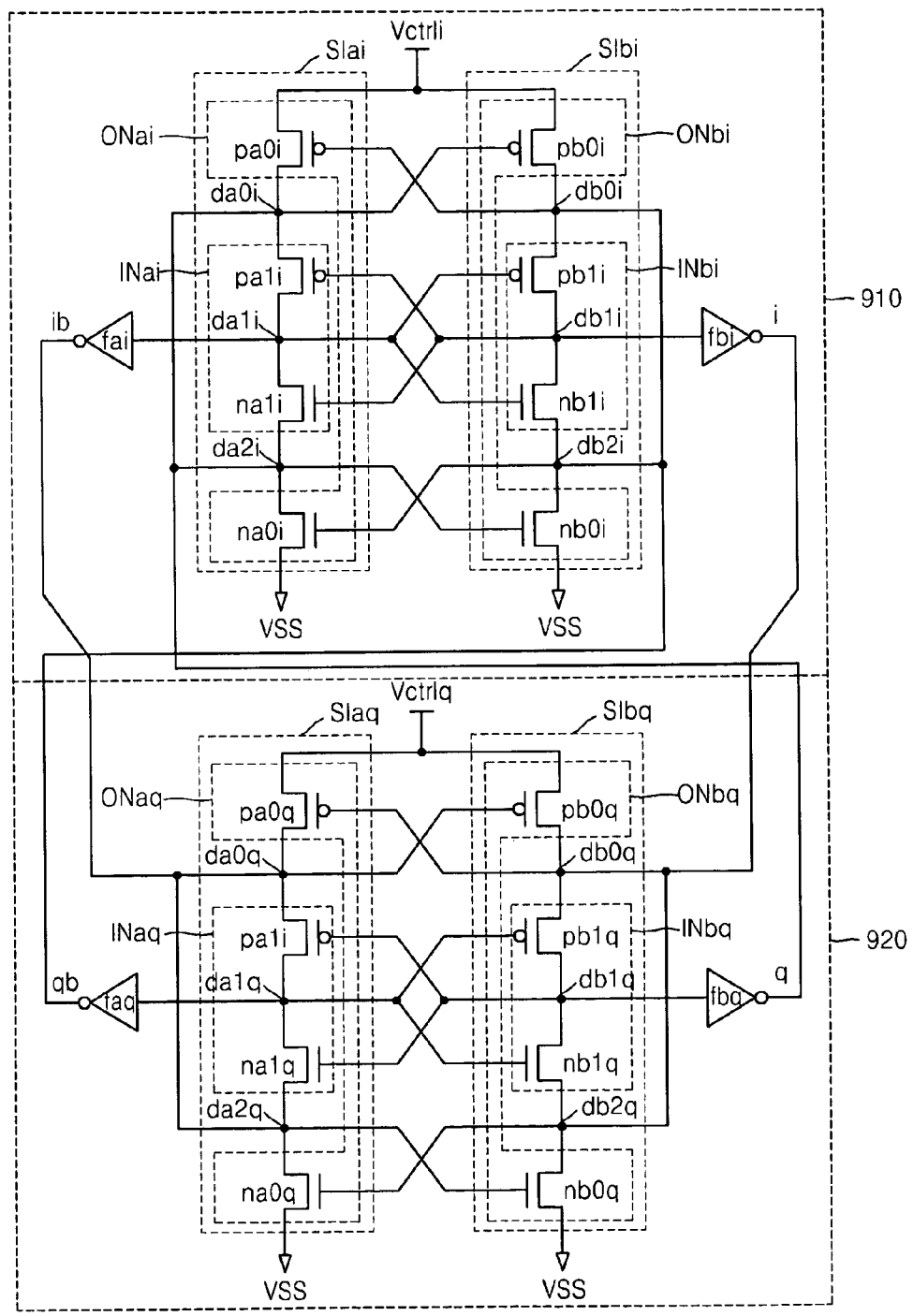
FIG. 9 illustrates an oscillator generating phase offset oscillation signals according to an embodiment.
Figure 10:
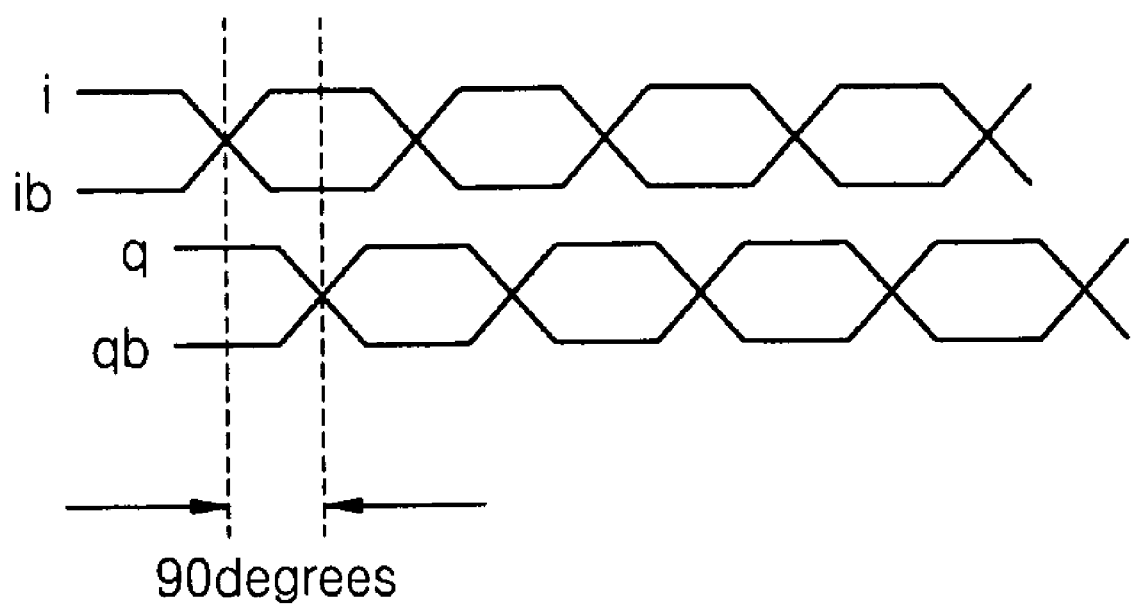
FIG. 10 illustrates the oscillation signal generated by the embodiment of FIG. 9.

FIG. 9 illustrates another embodiment of an oscillator. This embodiment generates quadrature oscillation signals i(ib) and q(qb). As shown, the oscillator includes a first oscillator circuit 910 connected to a second oscillator circuit 920. The first oscillator circuit 910 generates the in-phase oscillation signal i(ib) as shown in FIG. 10, and the second oscillator circuit 920 generates the quadrature-phase signal q(qb) as shown in FIG. 10. As shown, in the embodiment of FIG. 10, the quadrature-phase oscillation signal q(qb) is 90 degrees out-of-phase with the in-phase oscillation signal i(ib).

The first and second oscillator circuits 910 and 920 each have the same structure as the oscillator embodiment of FIG. 1, except for the connection of the first and second inverters fa and fb in the respective first and second oscillator circuits 910 and 920. Accordingly, only these differences will be described in detail below for the sake of brevity. Furthermore, to distinguish between elements in the first oscillator circuit 910 and those in the second oscillator circuit 920, reference labels in the first oscillator circuit 910 include a suffix of "i" and reference labels in the second oscillator circuit 920 include a suffix of "q".

As shown in FIG. 9, while the first and third nodes da0$i$ and da2$i$ of the first oscillator circuit 910 are connected together, the output of the first inverter fai in the first oscillator circuit 910 is not connected to the first and third nodes da0$i$ and da2$i$. Instead, the output of the first inverter fai in the first oscillator 910 is connected to the first and third nodes da0$q$ and da2$q$ in the second oscillator circuit 920. Accordingly, the input of the first inverter fai is connected to the output of the first inner inverter INai of the first oscillator circuit 910, and the output of the first inverter fai is connected to the input of the second outer inverter ONbq of the second oscillator circuit 920. It may also be said that the first inverter fai connects the first starved inverters SIai and SIaq of the first and second inverter circuits 910 and 920.

Also, while the fourth and sixth nodes db0$i$ and db2$i$ in the first oscillator circuit 910 are connected together, the output of the second inverter fbi in the first oscillator circuit 910 is not connected to the fourth and sixth nodes db0$i$ and db2$i$. Instead, the output of the second inverter fbi in the first oscillator 910 is connected to the fourth and sixth nodes db0$q$ and db2$q$ in the second oscillator circuit 920. Accordingly, the input of the second inverter fbi is connected to the output of the second inner inverter INbi of the first oscillator circuit 910, and the output of the second inverter fbi is connected to the input of the first outer inverter ONaq of the second oscillator circuit 920. It may also be said that the second inverter fbi connects the second starved inverters SIbi and SIbq of the first and second oscillator circuits 910 and 920.

Turning to the second oscillator circuit 920, while the first and third nodes da0$q$ and da2$q$ of the second oscillator circuit 920 are connected together, the output of the first inverter faq in the second oscillator circuit 920 is not connected to the first and third nodes da0$q$ and da2$q$. Instead, the output of the first inverter faq in the second oscillator 920 is connected to the fourth and sixth nodes nb0$i$ and nb2$i$ in the first oscillator circuit 910. Accordingly, the input of the first inverter faq is connected to the output of the first inner inverter INaq of the second oscillator circuit 920, and the output of the first inverter faq is connected to the input of the first outer inverter ONai of the first oscillator circuit 910. It may also be said that the first inverter faq connects the first starved inverter SIaq of the second inverter circuit 920 to the second starved inverter SIbi of the first inverter circuit 910.

Also, while the fourth and sixth nodes db0$q$ and db2$q$ in the second oscillator circuit 920 are connected together, the output of the second inverter fbq in the second oscillator circuit 920 is not connected to the fourth and sixth nodes db0$q$ and db2$q$. Instead, the output of the second inverter fbq in the second oscillator 920 is connected to the first and third nodes da0$i$ and da2$i$ in the first oscillator circuit 910. Accordingly, the input of the second inverter fbq is connected to the output of the second inner inverter INbq of the second oscillator circuit 920, and the output of the second inverter fbq is connected to the input of the second outer inverter ONbi of the first oscillator circuit 910. It may also be said that the second inverter fbq connects the second starved inverter SIbq of the second oscillator circuit 920 to the first starved inverter SIai of the first oscillator circuit 910.

Figure 11:
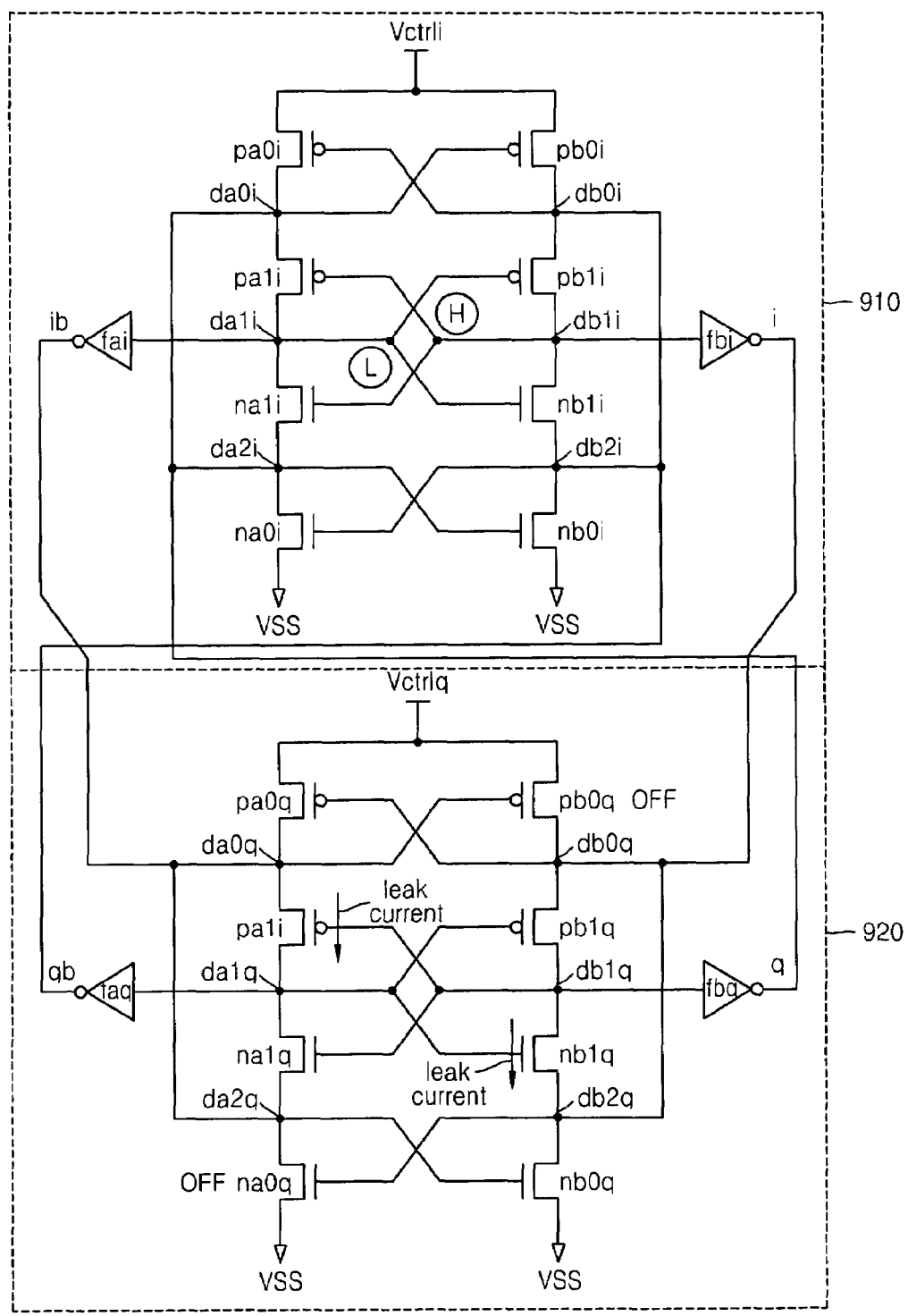
FIGS. 11-14 illustrate operation of the oscillator in FIG. 9.

Next, operation of the oscillator of FIG. 9 will be described in detail with respect to FIGS. 11-14, and will be described by comparison and reference to the operation of the embodiment of FIG. 1, which was described above with respect to FIGS. 2-3. The same assumptions made with respect to the high and low voltages H and L discussed above with respect to FIGS. 2 and 3 apply to FIGS. 11-14 as well. FIG. 11 is analogous to FIG. 2 in that FIG. 11 shows the second node da1$i$ of the first oscillator circuit 910 at the low voltage L and the fifth node db1$i$ of the first oscillator circuit 910 at the high voltage. Accordingly, the first and second inverters fai and fbi of the first oscillator circuit 910 output high and low voltages, respectively, as the in-phase oscillation signals ib and i. These high and low voltages are supplied to the second oscillator circuit 920 instead of the first oscillator circuit 910.

However, in comparison to the operation of the oscillator described with respect to FIG. 2, the high and low voltages output by the first and second inverters fai and fbi are supplied to the same corresponding nodes of the second oscillator circuit 920 As such, and with reference to the description of FIG. 2: the third PMOS transistor pb0$q$ and first NMOS transistor na0$q$ of the second oscillator circuit 920 are turned off; current leaks via the second PMOS transistor pa1$q$ to the second node da1$q$ of the second oscillator circuit 920; and current leaks via the fourth NMOS transistor nb1$q$ from the fifth node db1$q$ of the second oscillator circuit 920. Accordingly, this will have the effect of producing a high voltage H at the second node da1$q$ and a low voltage L at the fifth node db1q, and the first and second inverters faq and fbq are tripped to output low and high voltages as the quadrature-phase oscillation signals qb and q, respectively.

Figure 12:
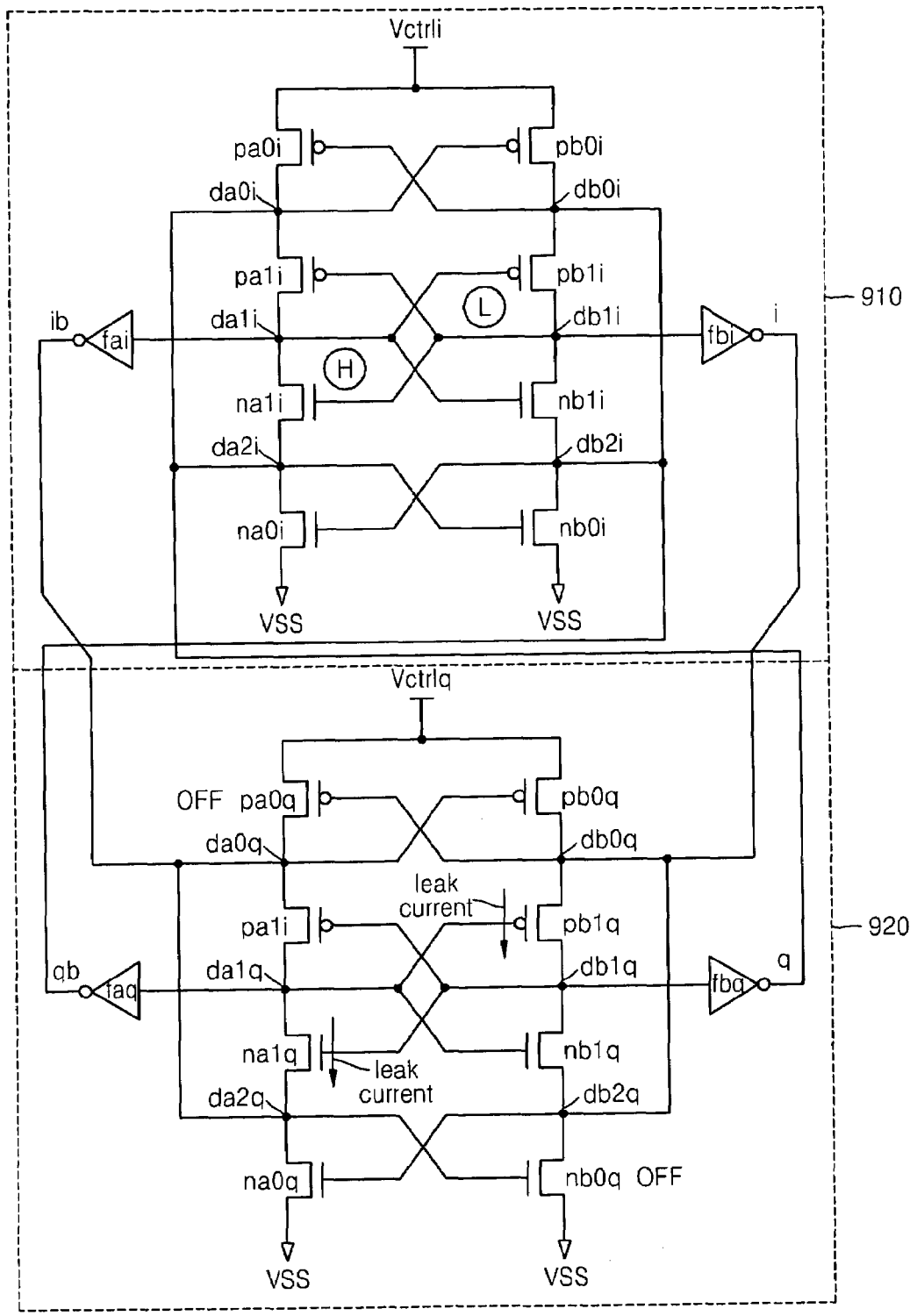

FIG. 12 is analogous to FIG. 3 in that FIG. 12 shows the second node da1i of the first oscillator circuit 910 at the high voltage H and the fifth node db1 of the first oscillator circuit 910 at the low voltage. Accordingly, the first and second inverters fai and fbi of the first oscillator circuit 910 output low and high voltages, respectively, as the in-phase oscillation signals ib and i. These low and high voltages are supplied to the second oscillator circuit 920 instead of the first oscillator circuit 910.

However, in comparison to the operation of the oscillator described with respect to FIG. 3, the low and high voltages output by the first and second inverters fai and fbi are supplied to the same corresponding nodes of the second oscillator circuit 920 As such, and with reference to the description of FIG. 3: the first PMOS transistor pa0q and third NMOS transistor na0q of the second oscillator circuit 920 are turned off; current leaks via the second NMOS transistor na1q from the second node da1q of the second oscillator circuit 920; and current leaks via the fourth PMOS transistor pb1q to the fifth node db1q of the second oscillator circuit 920. Accordingly, this will have the effect of producing a low voltage L at the second node da1q and a high voltage L at the fifth node db1q, and the first and second inverters faq and fbq are tripped to output high and low voltages as the quadrature-phase oscillation signals qb and q, respectively.

Figure 13:
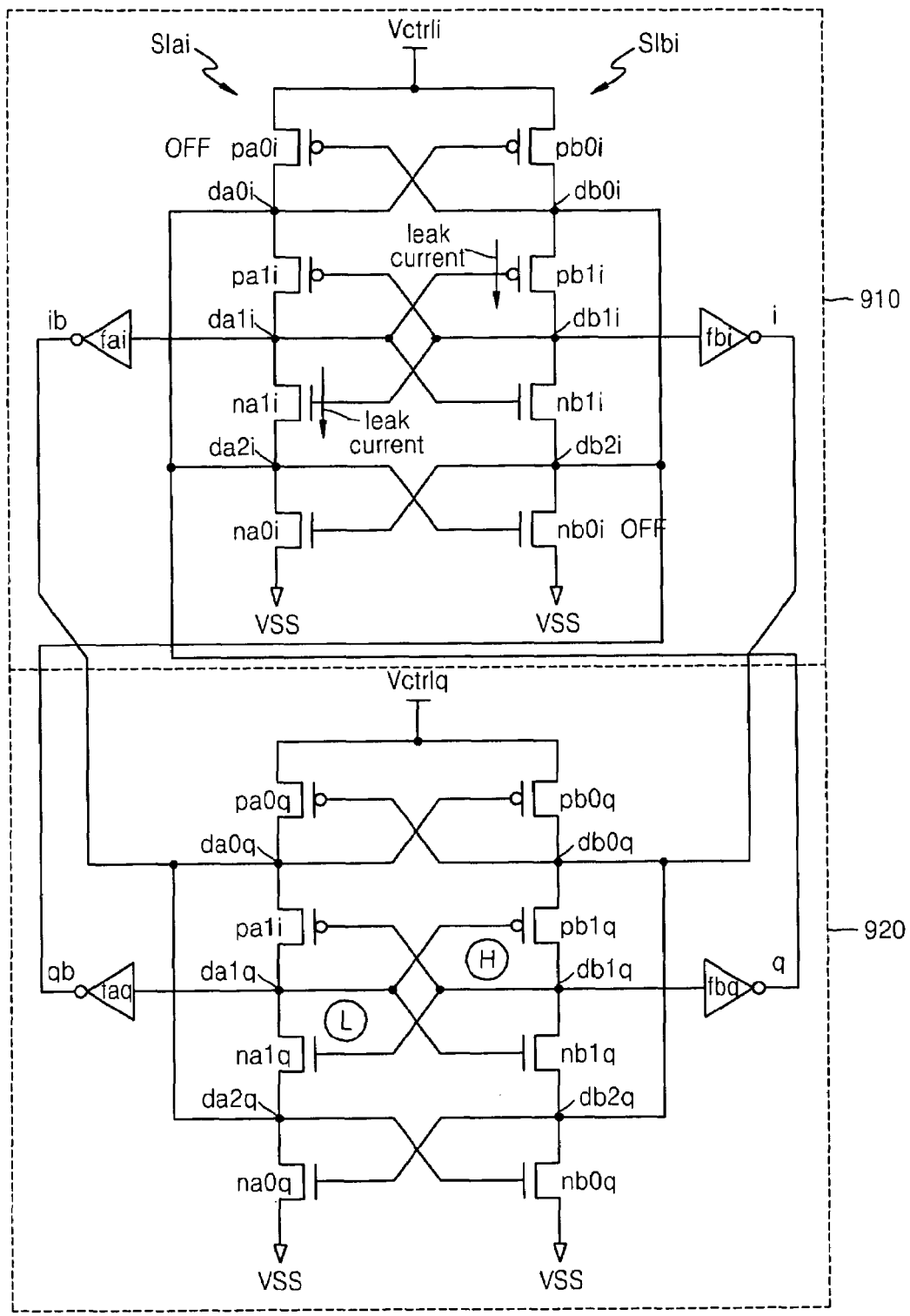

FIG. 13 is analogous to FIG. 2 in that FIG. 13 shows the second node da1i of the second oscillator circuit 920 at the low voltage L and the fifth node db1 of the second oscillator circuit 920 at the high voltage. Accordingly, the first and second inverters faq and fbq of the second oscillator circuit 920 output high and low voltages, respectively, as the quadrature-phase oscillation signals qb and q. These high and low voltages are supplied to the first oscillator circuit 910 instead of the second oscillator circuit 920.

However, in comparison to the operation described above with respect to FIG. 11, the high and low voltages output by the first and second inverters faq and fbq are supplied to the second and first starved inverters SIbi and SIai, respectively, of the first oscillator circuit 910. As such, the third PMOS transistor pb0i and first NMOS transistor na0i of the first oscillator circuit 910 are turned on; the first PMOS transistor pa0i and the third NMOS transistor nb0i are turned off; current leaks via the second NMOS transistor na1i from the second node da1i of the first oscillator circuit 910; and current leaks via the fourth PMOS transistor pb1i to the fifth node db1i of the first oscillator circuit 910. Accordingly, this will have the effect of producing a low voltage L at the second node da1i and a high voltage H at the fifth node db1i, and the first and second inverters fai and fbi are tripped to output high and low voltages as the in-phase oscillation signals ib and i, respectively.

Figure 14:
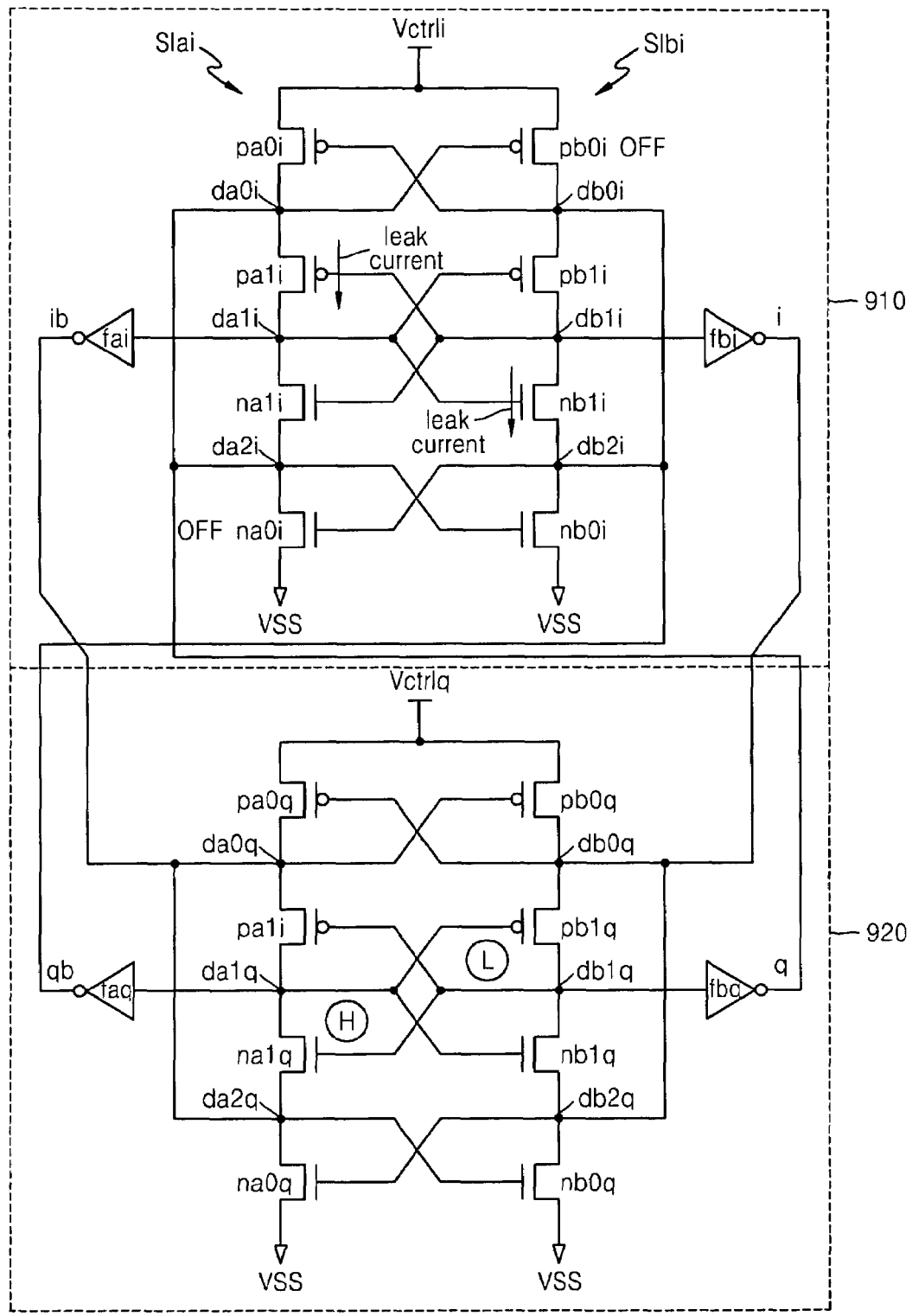

FIG. 14 is analogous to FIG. 3 in that FIG. 14 shows the second node da1q of the second oscillator circuit 920 at the high voltage H and the fifth node db1q of the second oscillator circuit 920 at the low voltage. Accordingly, the first and second inverters faq and fbq of the second oscillator circuit 920 output low and high voltages, respectively, as the quadrature-phase oscillation signals qb and q. These low and high voltages are supplied to the first oscillator circuit 910 instead of the second oscillator circuit 920.

However, in comparison to the operation of the oscillator described with respect to FIG. 3, the low and high voltages output by the first and second inverters faq and fbq are supplied to the second and first starved inverters SIbi and SIai, respectively, of the first oscillator circuit 910. As such, the first PMOS transistor pa0i and the third NMOS transistor nb0i of the first oscillator circuit 910 are turned on, the third PMOS transistor pb0i and first NMOS transistor na0i of the first oscillator circuit 910 are turned off; current leaks via the second PMOS transistor pa1i to the second node da1i of the first oscillator circuit 910; and current leaks via the fourth NMOS transistor nb1i from the fifth node db1i of the first oscillator circuit 910. Accordingly, this will have the effect of producing a high voltage H at the second node da1i and a low voltage L at the fifth node db1i, and the first and second inverters fai and fbi are tripped to output low and high voltages as the in-phase oscillation signals ib and i, respectively.

The configuration of the oscillator in the embodiment of FIG. 9 naturally or inherently produces the quadrature-phase oscillation signal q(qb) 90 degrees out-of-phase with the in-phase oscillation signal i(ib) if the first control voltage Vctrli applied to the first oscillator circuit 910 is the same as the second control voltage Vctrlq applied to the second oscillator circuit 920. However, this phase difference may be changed by changing the first and second control voltages Vctrli and Vctrlq with respect to one another. Namely, creating a difference between the first and second control voltages Vctrli and Vctrlq changes the phase difference between the in-phase and quadrature phase oscillation signals from 90 degrees.

Figure 15A:
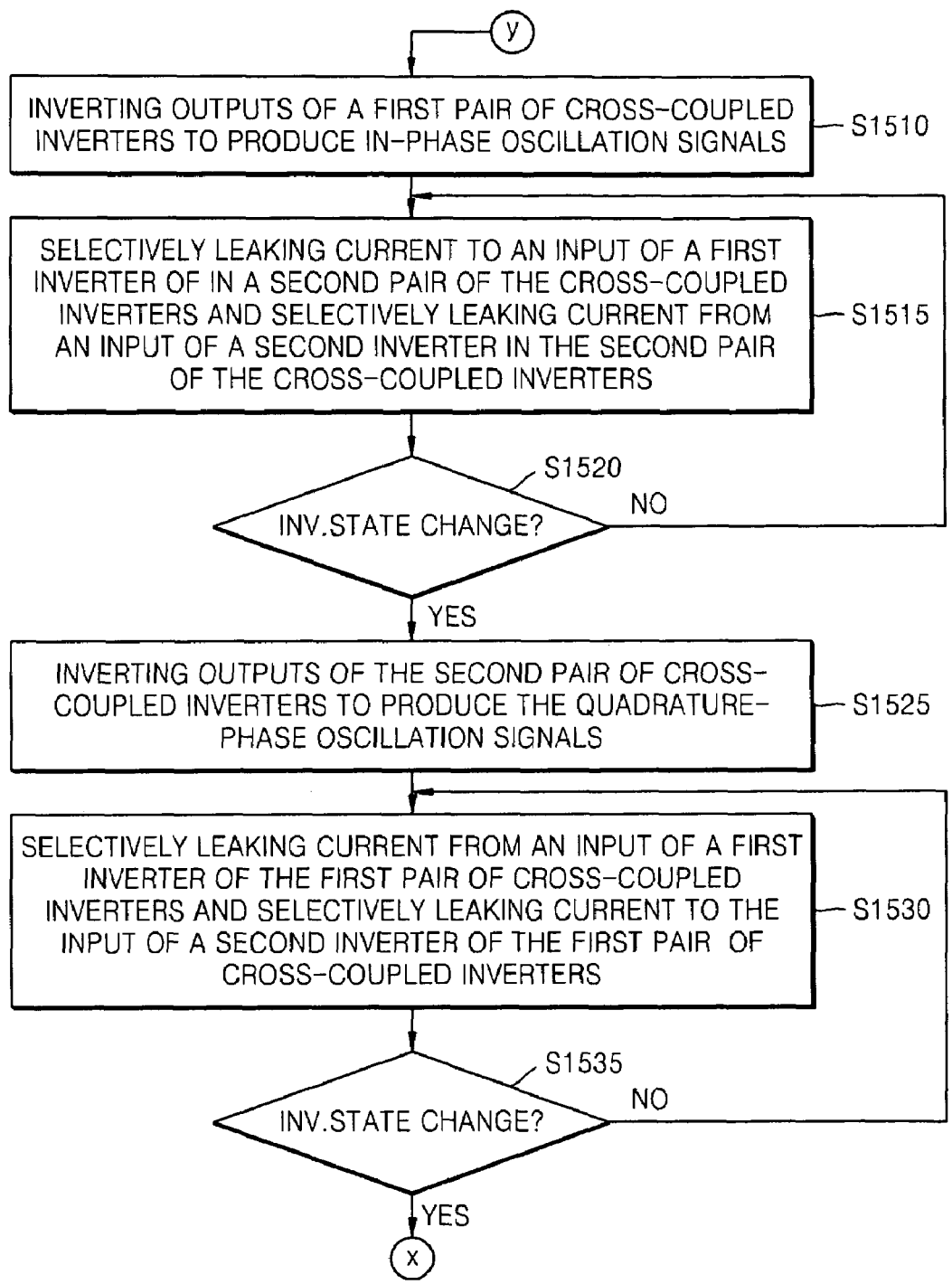
FIGS. 15A-15B illustrate a flow chart for conceptually describing a method of generating oscillating signals according to the embodiment of FIG. 9.
Figure 15B:
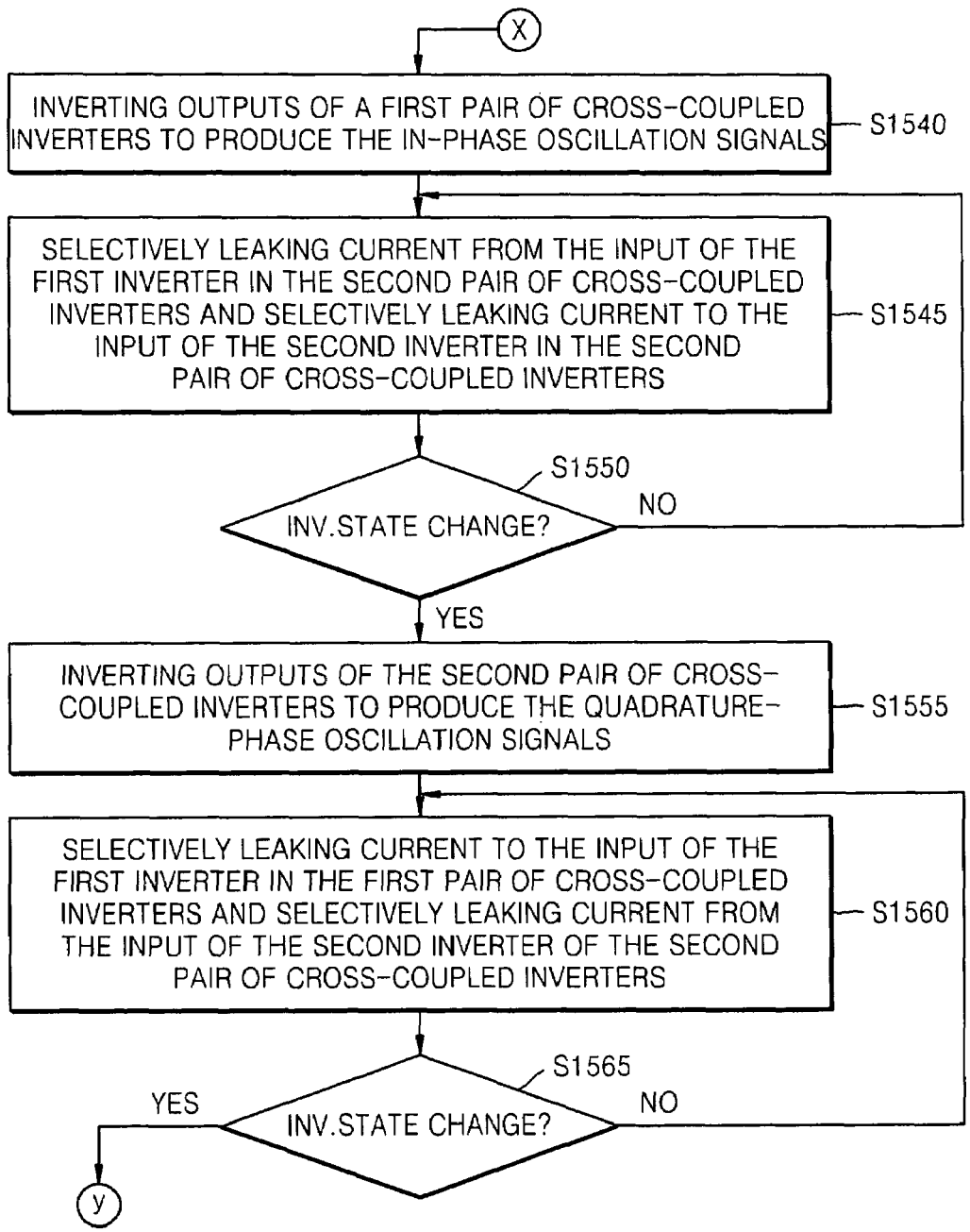

FIGS. 15A-15B illustrate a flow chart for conceptually describing a method of generating oscillating signals according to the embodiment of FIG. 9. As shown, and with reference to FIG. 9 as well, in step S1510, the outputs of the first and second inner inverters INai and INbi of the first oscillator circuit 910, which are cross-coupled, are inverted by the first and second inverters fai and fbi, respectively, of the first oscillator circuit 910 to produce the in-phase oscillation signals ib and i, respectively. In step S1515, in response to the output of the first and second inverters fai and fbi of the first oscillator circuit 910, the first stage of the second oscillator circuit 920 leaks current to the input of one of the first and second inner inverters INaq and INbq, while leaking current from the input of the other one of the first and second inner inverters INaq and INbq. For example, as shown in FIG. 11, current may leak to the input of the second inner inverter INbq while current leaks from the input of the first inner inverter INaq. The leaking of current in step S1515 occurs until the cross-coupled inverters INaq and INbq of the second oscillator circuit 920 change their respective inversion states as shown by step S1520.

If the cross-coupled inverters INaq and INbq change their respective inversion states (e.g., are tripped), then the outputs of the inverters INaq and INbq are inverted by the first and second inverters faq and fbq of the second oscillator circuit 920 to produce the quadrature-phase oscillation signals qb and q in step S1525. Namely, once the cross-coupled inverters INaq and INbq change state, then the quadrature-phase oscillation signals change state.

Next, in step S1530, in response to the output of the first and second inverters faq and fbq of the second oscillator circuit 920, the first stage of the first oscillator circuit 910 leaks current to the input of one the first and second inner inverters INai and INbi, while leaking current from the input of the other one of the first and second inner inverters INai and INbi. For example, assuming step S1515 followed the example operation of FIG. 11, then as shown in FIG. 14, current may leak from the input of the first inner inverter INai while current leaks to the input of the second inner inverter INbi. The leaking of current in step S1530 occurs until the cross-coupled inverters INai and INbi of the first oscillator circuit 910 change their respective inversion states as shown by step S1535.

If the cross-coupled inverters INai and INbi of the first oscillator circuit 910 change their respective inversion states (e.g., are tripped), then the outputs of the cross-coupled inverters INai and INbi are inverted by the first and second inverters fai and fbi of the first oscillator circuit 910 to produce the in-phase oscillation signals ib and i in step S1540 as shown in FIG. 15B. Namely, once the cross-coupled inverters INai and INbi change state, then the in-phase oscillation signals change state.

In step S1545, in response to the output of the first and second inverters fai and fbi of the first oscillator circuit 910, the first stage of the second oscillator circuit 920 leaks current to the input of one of the first and second inner inverters INaq and INbq, while leaking current from the input of the other one of the first and second inner inverters INaq and INbq. For example, as shown in FIG. 12, current may leak from the input of the second inner inverter INbq while current leaks to the input of the first inner inverter INaq. The leaking of current in step S1545 occurs until the cross-coupled inverters INaq and INbq of the second oscillator circuit 920 change their respective inversion states as shown by step S1550.

If the cross-coupled inverters INaq and INbq change their respective inversion states (e.g., are tripped), then the outputs of the cross-coupled inverters INaq and INbq are inverted by the first and second inverters faq and fbq of the second oscillator circuit 920 to produce the quadrature-phase oscillation signals iq and q in step S1555. Namely, once the cross-coupled inverters INaq and INbq change state, then the quadrature-phase oscillation signals change state.

Next, in step S1560, in response to the output of the first and second inverters faq and fbq of the second oscillator circuit 920, the first stage of the first oscillator 910 leaks current to the input one the first and second inner inverters INai and INbi, while leaking current from the input of the other one of the first and second inner inverters INai and INbi. For example, assuming step S1545 followed the example operation of FIG. 12, then as shown in FIG. 13, current may leak to the input of the first inner inverter INai while current leaks from the input of the second inner inverter INbi. The leaking of current in step S1560 occurs until the cross-coupled inverters INai and INbi of the first oscillator circuit 910 change their respective inversion states as shown by step S1565.

If the cross-coupled inverters INai and INbi of the first oscillator circuit 910 change their respective inversion states (e.g., are tripped), then processing returns to step S1510 of FIG. 15A and the outputs of the cross-coupled inverters INai and INbi are inverted by the first and second inverters fai and fbi of the first oscillator circuit 910 to produce the in-phase oscillation signals ib and i. Namely, once the cross-coupled inverters INai and INbi change state, then the in-phase oscillation signals change state.

Figure 16:
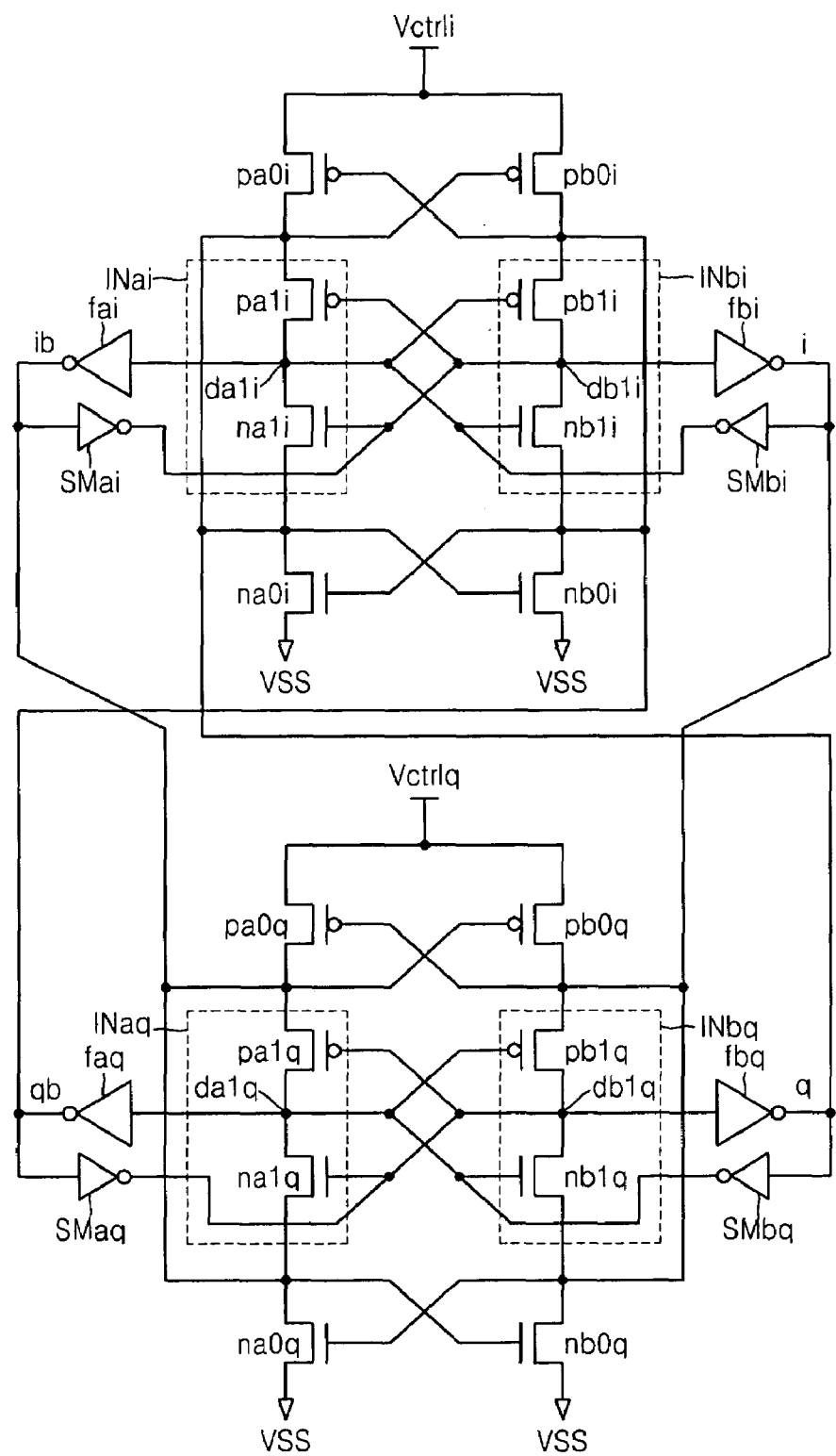
FIGS. 16-25 each illustrate a further embodiment of the oscillator.

FIG. 16 illustrates another embodiment of an oscillator. This embodiment is the same as the embodiment of FIG. 9 except that the embodiment of FIG. 16 includes first and second smaller inverters SMai and SMbi in the first oscillator circuit 910 and first and second smaller inverters SMaq and SMbq in the second oscillator circuit 920. The first and second smaller inverters SMai and SMbi have a smaller size than the first and second inverters fai and fbi in the first oscillator circuit 910. Similarly, the first and second smaller inverters SMaq and SMbq have a smaller size than the first and second inner inverter faq and fbq of the second oscillator circuit 920. In one embodiment, the first and second inverters fai and fbi of the first oscillator circuit 910 have the same size as the first and second inverters faq and fbq of the second oscillator circuit 920. In one embodiment, the transistors forming the smaller inverters SMai/SMaq and SMbi/SMbq are the smallest size permitted by the processing technology used to create the oscillator. As will be appreciated, the size of the other inverters depends on the application, desired operation frequency, etc. of the oscillator; namely, is a design constraint.

As shown, in the first oscillator circuit 910, the first smaller inverter SMai is connected between the output of the first inverter fai and the fifth node db1$i$. Namely, the first smaller inverter SMai inverts the output of the first inverter fai, and supplies the inverted output to the inputs of the first inner inverter INai and the second inverter fbi. Similarly, the second smaller inverter SMbi is connected between the output of the second inverter fbi and the second node da1$i$. Namely, the second smaller inverter SMbi inverts the output of the second inverter fbi, and supplies the inverted output to the inputs of the second inner inverter INbi and the first inverter fai.

As shown, in the second oscillator circuit 920, the first smaller inverter SMaq is connected between the output of the first inverter faq and the fifth node db1$q$. Namely, the first smaller inverter SMaq inverts the output of the first inverter faq, and supplies the inverted output to the inputs of the first inner inverter INaq and the second inverter fbq. Similarly, the second smaller inverter SMbq is connected between the output of the second inverter fbq and the second node da1$q$. Namely, the second smaller inverter SMbq inverts the output of the second inverter fbq, and supplies the inverted output to the inputs of the second inner inverter INbq and the first inverter faq.

The first and second smaller inverters SMai/SMaq and SMbi/SMbq create additional current paths for changing the inversion state of the cross-coupled inverters INai/INaq and INbi/INbq as well as the first and second inverters fai/faq and fbi/fbq. As such, addition of the first and second smaller inverters SMai/SMaq and SMbi/SMbq increases the maximum frequency of the in-phase and quadrature-phase oscillation signals i(ib) and q(qb).

Figure 17:
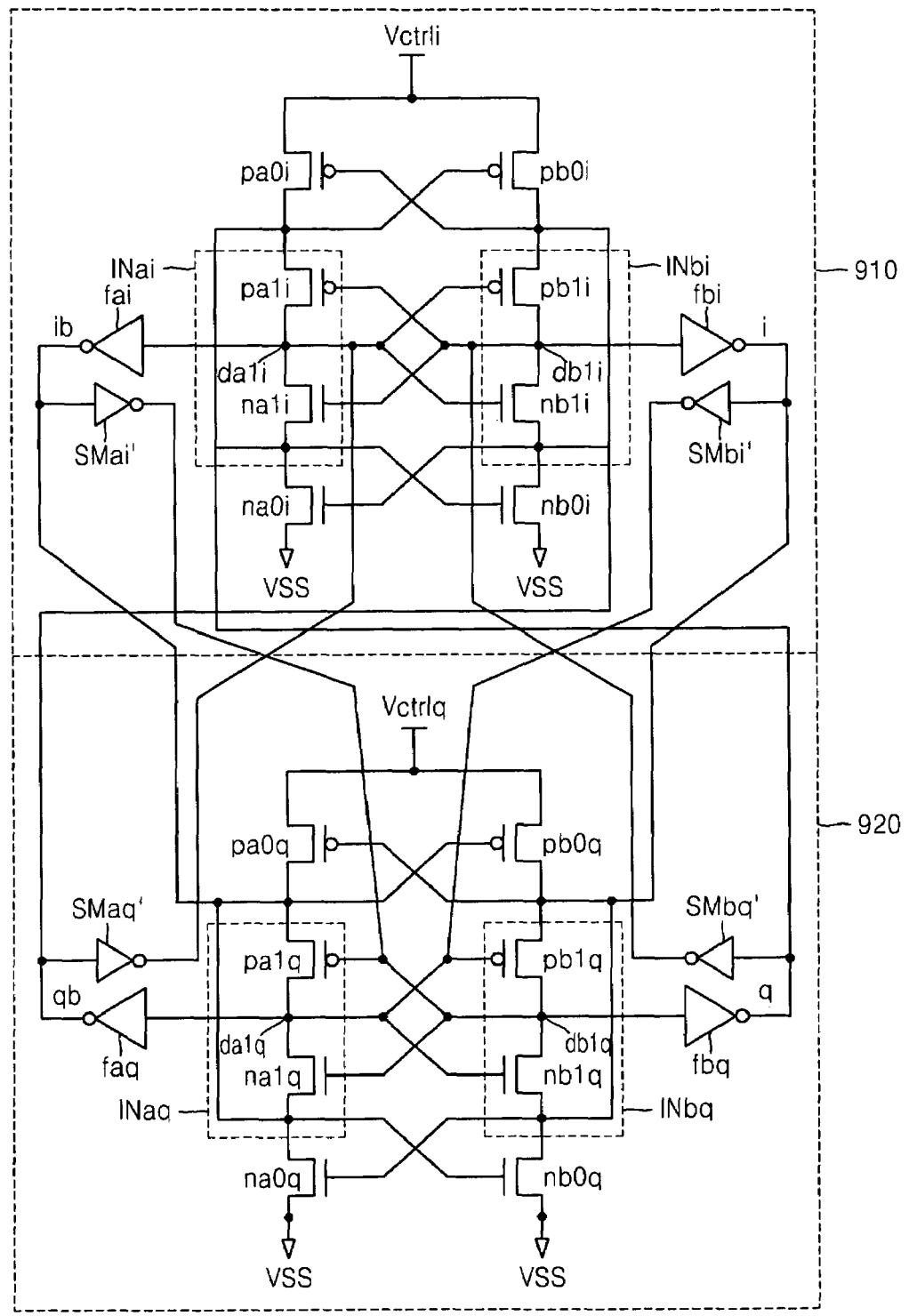

FIG. 17 illustrates another embodiment of an oscillator including smaller inverters. This embodiment is the same as the embodiment of FIG. 9 except that the embodiment of FIG. 17 includes first and second smaller inverters SMai' and SMbi' in the first oscillator circuit 910 and first and second smaller inverters SMaq' and SMbq' in the second oscillator circuit 920. The first and second smaller inverters SMai' and SMbi' have a smaller size than the first and second inverters fai and fbi in the first oscillator circuit 910. Similarly, the first and second smaller inverters SMaq' and SMbq' have a smaller size than the first and second inner inverter faq and fbq of the second oscillator circuit 920. In one embodiment, the first and second inverters fai and fbi of the first oscillator circuit 910 have the same size as the first and second inverters faq and fbq of the second oscillator circuit 920. In one embodiment, the transistors forming the smaller inverters SMai'/SMaq' and SMbi'/SMbq' are the smallest size permitted by the processing technology used to create the oscillator. As will be appreciated, the size of the other inverters depends on the application, desired operation frequency, etc. of the oscillator; namely, is a design constraint.

As shown, the first smaller inverter SMai' in the first oscillator circuit 910 is connected between the output of the first inverter fai in the first oscillator circuit 910 and the fifth node db1$q$ in the second oscillator circuit 920. Namely, the first smaller inverter SMai' inverts the output of the first inverter fai in the first oscillator circuit 910, and supplies the inverted output to the inputs of the first inner inverter INaq and the second inverter fbq in the second oscillator circuit 920. Similarly, the second smaller inverter SMbi' in the first oscillator circuit 910 is connected between the output of the second inverter fbi in the first oscillator circuit and the second node da1q in the second oscillator circuit 920. Namely, the second smaller inverter SMbi' inverts the output of the second inverter fbi of the first oscillator circuit 910, and supplies the inverted output to the inputs of the second inner inverter INbq and the first inverter faq of the second oscillator circuit 920.

As shown, in the second oscillator circuit 920, the first smaller inverter SMaq' is connected between the output of the first inverter faq of the second oscillator circuit 920 and the second node da1i of the first oscillator circuit 910. Namely, the first smaller inverter SMaq' inverts the output of the first inverter faq in the second oscillator circuit 920, and supplies the inverted output to the inputs of the second inner inverter INbi and the first inverter fai in the first oscillator circuit 910. Similarly, the second smaller inverter SMbq' is connected between the output of the second inverter fbq of the second oscillator circuit 920 and the fifth node da1i of the first oscillator circuit 910. Namely, the second smaller inverter SMbq inverts the output of the second inverter fbq in the second oscillator circuit 920, and supplies the inverted output to the inputs of the first inner inverter INai and the second inverter fbi of the first oscillator circuit.

The first and second smaller inverters SMai'/SMaq' and SMbi'/SMbq' create additional current paths for changing the inversion state of the cross-coupled inverters INai/INaq and INbi/INbq as well as the first and second inverters fai/faq and fbi/fbq. As such, addition of the first and second smaller inverters SMai'/SMaq' and SMbi'/SMbq' increases the maximum frequency of the in-phase and quadrature-phase oscillation signals i(ib) and q(qb).

Figure 18:
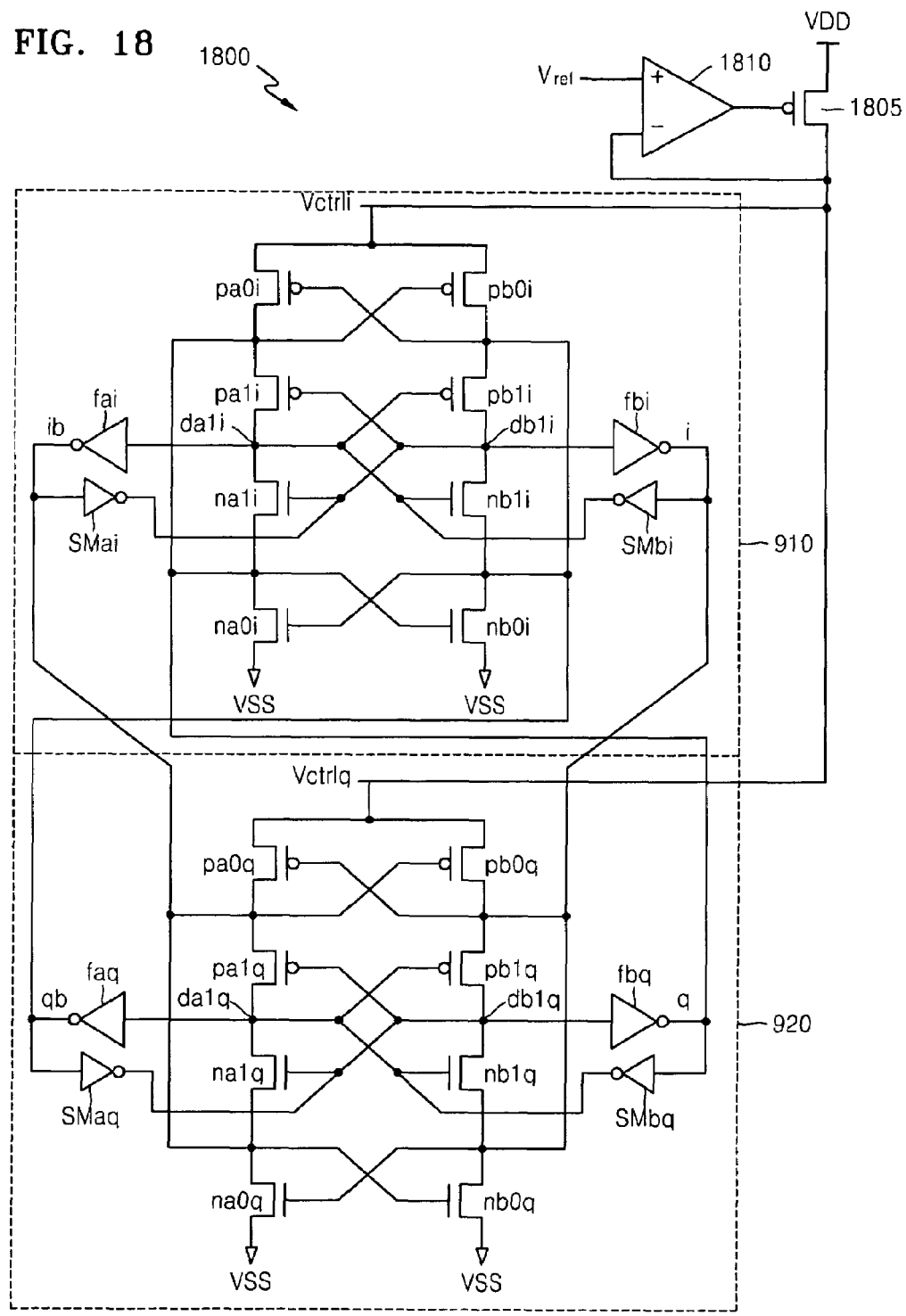

FIG. 18 illustrates the embodiment of FIG. 16 connected to a control voltage generating circuit. It will be appreciated that the embodiment of FIG. 16 has been shown in conjunction with the control voltage generating circuit 1800 merely as an example, and that application of this control voltage generating circuit 1800 is not limited to the embodiment of FIG. 16. For example, the control voltage generating circuit 1800 may be connected to the embodiment of FIG. 9.

As shown, the control voltage generating circuit 1800 includes a PMOS transistor 1805 connected between a supply voltage VDD and the first and third PMOS transistors pa0i and pb0i of the first oscillator circuit 910 in FIG. 16 as well as the first and third PMOS transistors pa0q and pb0q in the second oscillator circuit 920 in FIG. 16. An operational amplifier 1810 has its output connected to the gate of the PMOS transistor 1805. The non-inverting input of the operational amplifier 1810 receives a reference voltage Vref, and the inverting input of the operational amplifier 1810 receives the control voltage Vctrl supplied by the PMOS transistor 1805 to the oscillator of FIG. 18. By changing the reference voltage Vref, the control voltage Vctrl changes. Namely, the control voltage Vctrl may be controlled by controlling the reference voltage Vref. The control voltage Vctrl is supplied as control voltage to both the first and second oscillator circuits 910 and 920, and affects the frequency of the in-phase and quadrature-phase oscillation signals i(ib) and q(qb). Namely, as the control voltage Vctrl increases, the frequency of the in-phase and quadrature-phase oscillation signals i(ib) and q(qb) increases. As will be appreciated, a maximum value of the control voltage Vctrl is limited to the power supply voltage VDD.

Figure 19:
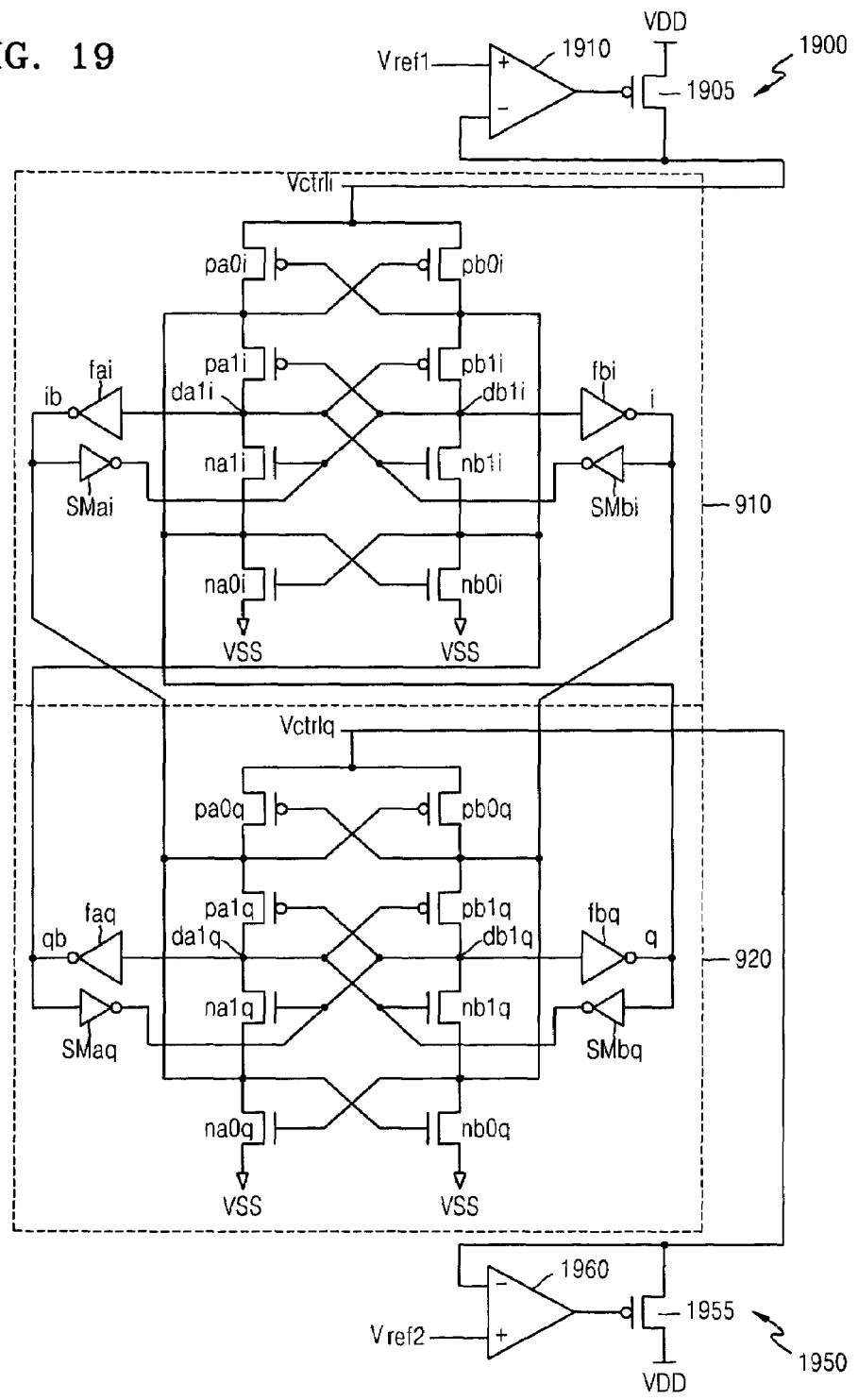

FIG. 19 illustrates the embodiment of FIG. 16 connected to a first and second control voltage generating circuits. It will be appreciated that the embodiment of FIG. 16 has been shown in conjunction with the first control voltage generating circuit 1900 and the second control voltage generating circuit 1950 merely as an example, and that application of these control voltage generating circuits 1900 and 1950 is not limited to the embodiment of FIG. 16. For example, the first and second control voltage generating circuits 1900 and 1950 may be connected to the embodiment of FIG. 9.

As shown, the first control voltage generating circuit 1900 includes a PMOS transistor 1905 connected between a supply voltage VDD and the first and third PMOS transistors pa0i and pb0i of the first oscillator circuit 910 in FIG. 16. An operational amplifier 1910 has its output connected to the gate of the PMOS transistor 1905. The non-inverting input of the operational amplifier 1910 receives a first reference voltage Vref1, and the inverting input of the operational amplifier 1910 receives the control voltage Vctrli supplied by the PMOS transistor 1905 to the oscillator of FIG. 19. By changing the first reference voltage Vref1, the first control voltage Vctrli changes. Namely, the first control voltage Vctrli may be controlled by controlling the first reference voltage Vref1. The first control voltage Vctrli is supplied as control voltage to the first oscillator circuit 910.

As further shown, the second control voltage generating circuit 1950 includes a PMOS transistor 1955 connected between the supply voltage VDD and the first and third PMOS transistors pa0q and pb0q of the second oscillator circuit 920 in FIG. 16. An operational amplifier 1960 has its output connected to the gate of the PMOS transistor 1955. The non-inverting input of the operational amplifier 1960 receives a second reference voltage Vref2, and the inverting input of the operational amplifier 1960 receives the control voltage Vctrlq supplied by the PMOS transistor 1955 to the second oscillator circuit 920. By changing the second reference voltage Vref2, the second control voltage Vctrlq changes. Namely, the second control voltage Vctrlq may be controlled by controlling the second reference voltage Vref2. The second control voltage Vctrlq is supplied as control voltage to the second oscillator circuit 920.

The first and second control voltage Vctrli and Vctrlq affect the frequency and phase-difference between the in-phase and quadrature-phase signals i(ib) and q(qb). If the first and second control voltages are set equal, the in-phase and quadrature-phase signals i(ib) and q(qb) have a 90 degree phase offset. And, as the first and second control voltages Vctrli and Vctrlq are increased, the frequency of the in-phase and quadrature-phase signals i(ib) and q(qb) increases. Still further, if the first and second control voltages Vctrli and Vctrlq differ, the phase difference between the in-phase and quadrature-phase oscillation signals differs from 90 degrees. As will be appreciated, due to manufacturing margins, setting the first and second control voltages exactly the same may not result in an exact phase difference of 90 degrees between the in-phase and quadrature-phase oscillation signals i(ib) and q(qb). Accordingly, the first and second control voltages Vctrli and Vctrlq may be used to tune the oscillator to produce a more exact 90 degree phase difference between the in-phase and quadrature-phase oscillation signals i(ib) and q(qb).

Figure 20:
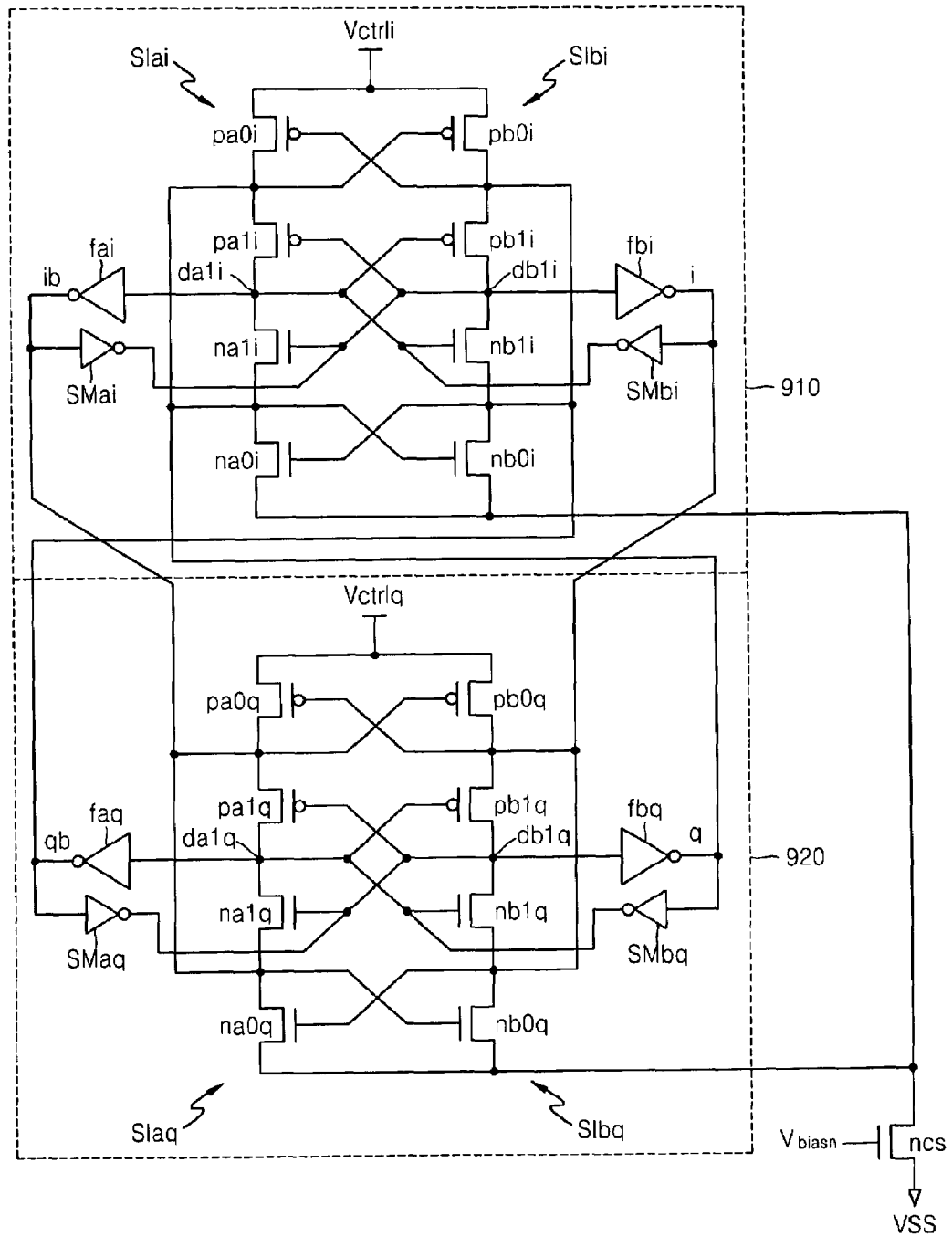

FIG. 20 illustrates another embodiment of an oscillator. This embodiment is the same as the embodiment of FIG. 16 except that the first and second starved inverters SIai/SIaq and SIbi/SIbq of the first and second oscillator circuits 910 and 920 are connected to an NMOS transistor ncs instead of ground VSS. The NMOS transistor ncs is connected between ground VSS and the first and third NMOS transistors na0i/na0q and nb0i/nb0q of the first and second oscillator circuits 910 and 920. The NMOS transistor ncs receives a control bias Vbiasn at its gate. The control bias Vbiasn controls the voltage level at the drains of the first and third NMOS transistors na0i/na0q and nb0i/nb0q. Changing this voltage level changes the frequency of the in-phase and quadrature-phase oscillation signals i(ib) and q(qb) produced by the oscillator. Namely, as the control bias Vbiasn increases, the frequency of the in-phase and quadrature-phase oscillation signals i(ib) and q(qb) increases.

Figure 21:
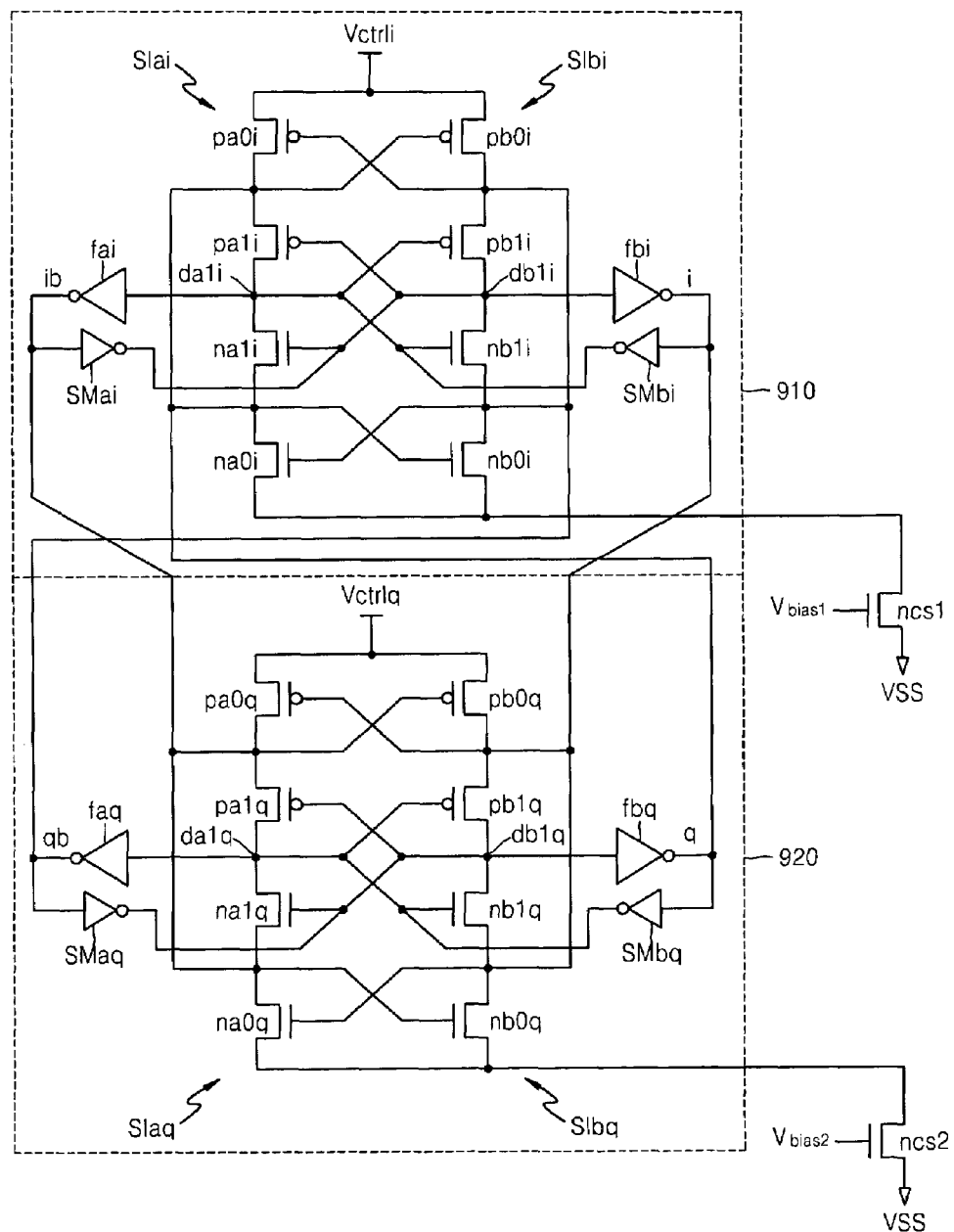

FIG. 21 illustrates another embodiment of an oscillator. This embodiment is the same as the embodiment of FIG. 16 except that: (i) the first and second starved inverters SIai and SIbi of the first oscillator circuit 910 are connected to a first bias NMOS transistor ncs1 instead of ground VSS; and (ii) the first and second starved inverters SIaq and SIbq of the second oscillator circuit 920 are connected to a second bias NMOS transistor ncs2 instead of ground VSS.

The first bias NMOS transistors ncs1 is connected between ground VSS and the first and third NMOS transistors na0i and nb0i of the first oscillator circuit 910. The second bias NMOS transistors ncs2 is connected between ground VSS and the first and third NMOS transistors na0q and nb0q of the second oscillator circuit 920. The first and second NMOS transistors ncs1 and ncs2 receive first and second control biases Vbiasn1 and Vbiasn2, respectively, at their gates. Accordingly, in this embodiment, the voltage level at the drains of the first and third NMOS transistors na0i and nb0i of first oscillator circuit 910 and the voltage level at the drains of the first and third NMOS transistors na0q and nb0q of the second oscillator circuit 920 may be independently controlled.

If the first and second control biases Vbiasn1 and Vbiasn2 are set equal, the in-phase and quadrature-phase signals i(ib) and q(qb) have a 90 degree phase offset. And, as the first and second control biases Vbiasn1 and Vbiasn2 are increased, the frequency of the in-phase and quadrature-phase signals i(ib) and q(qb) increases. Still further, if the first and second control biases Vbiasn1 and Vbiasn2 differ, the phase difference between the in-phase and quadrature phase oscillation signals differ from 90 degrees. As will be appreciated, due to manufacturing margins, setting the first and second control biases exactly the same may not result in an exact phase difference of 90 degrees between the in-phase and quadrature-phase oscillation signals i(ib) and q(qb). Accordingly, the first and second control biases Vbiasn1 and Vbiasn2 may be used to tune the oscillator to produce a more exact 90 degree phase difference between the in-phase and quadrature-phase oscillation signals i(ib) and q(qb).

Figure 22:
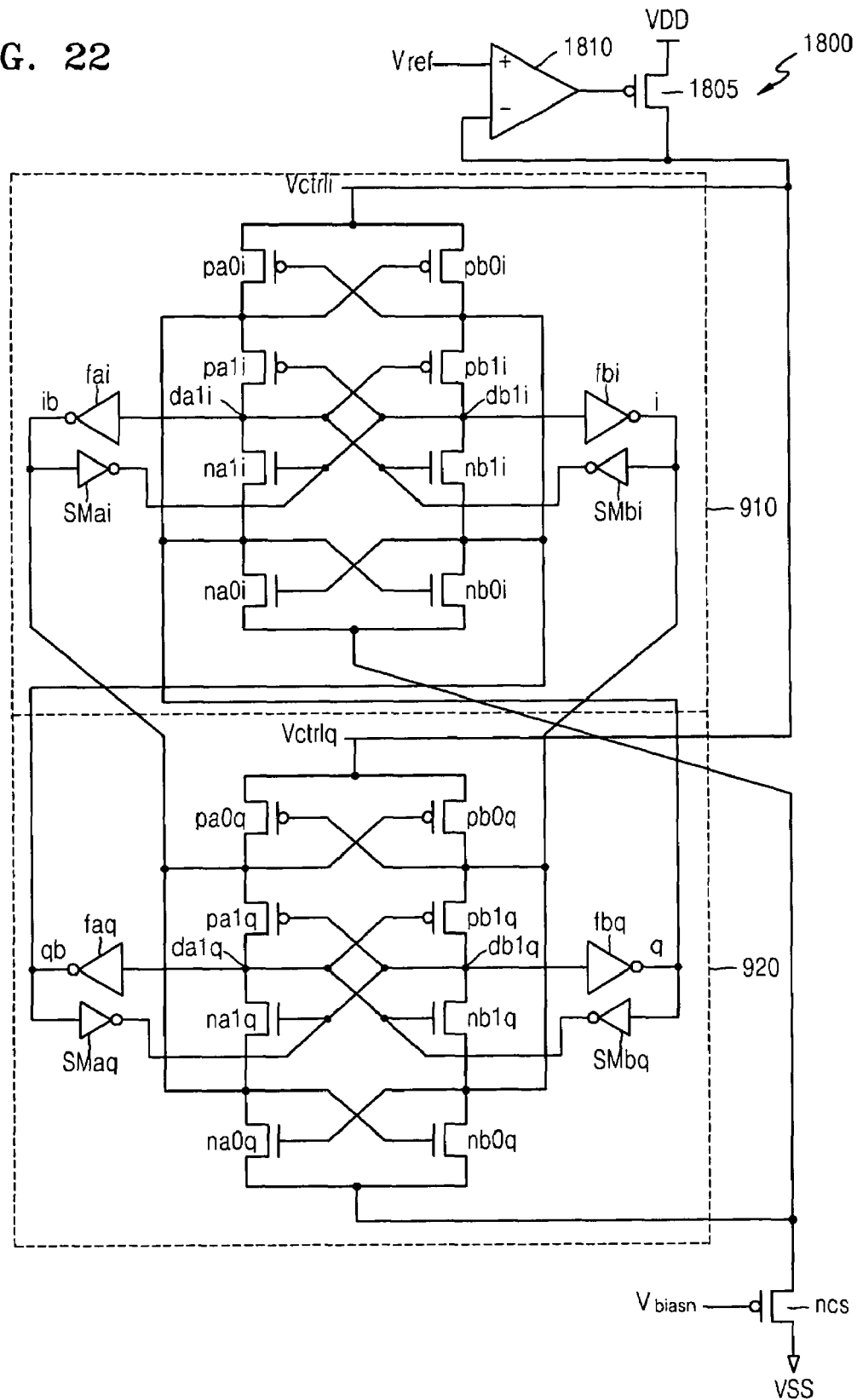
Figure 23:
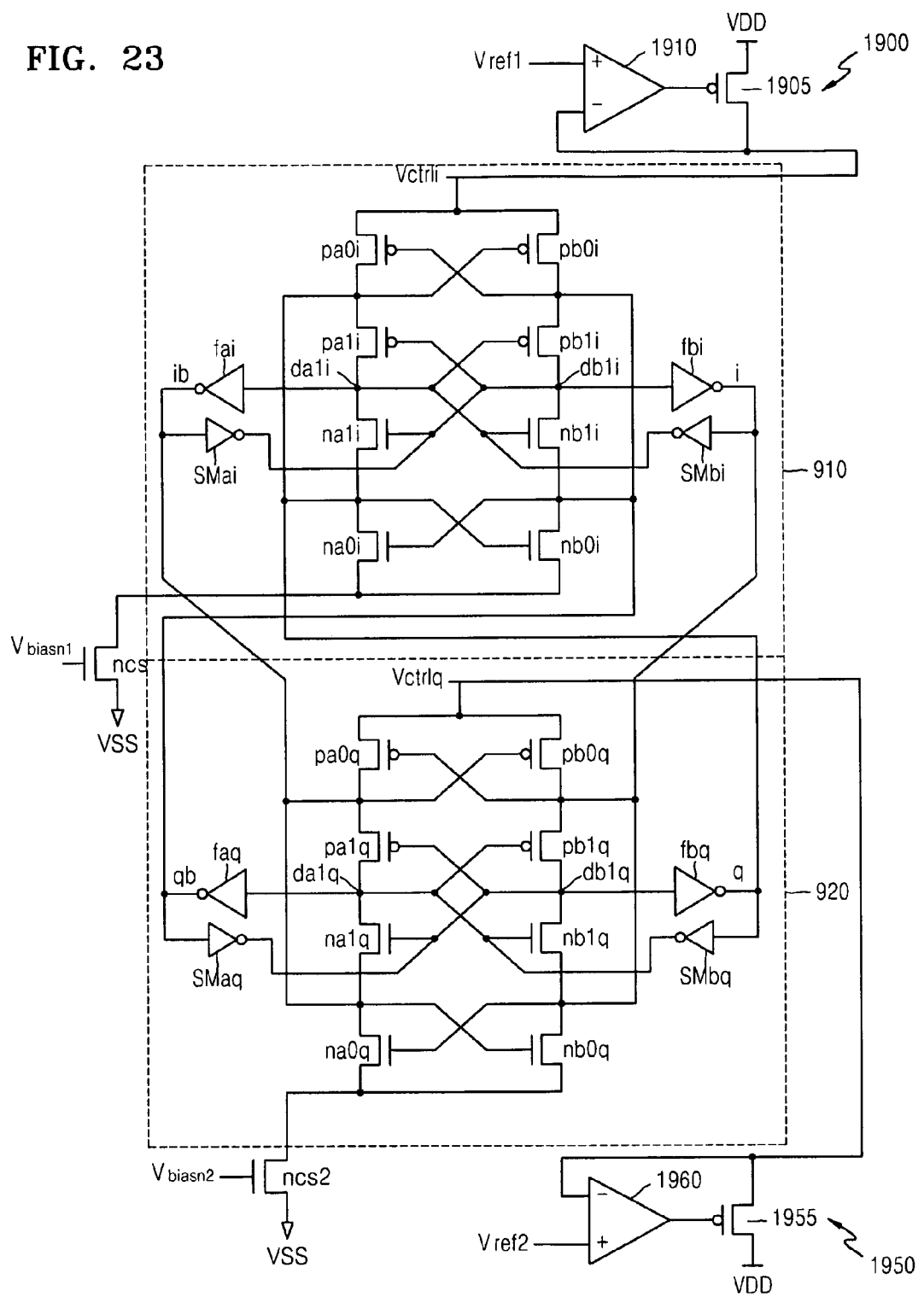
Figure 24:
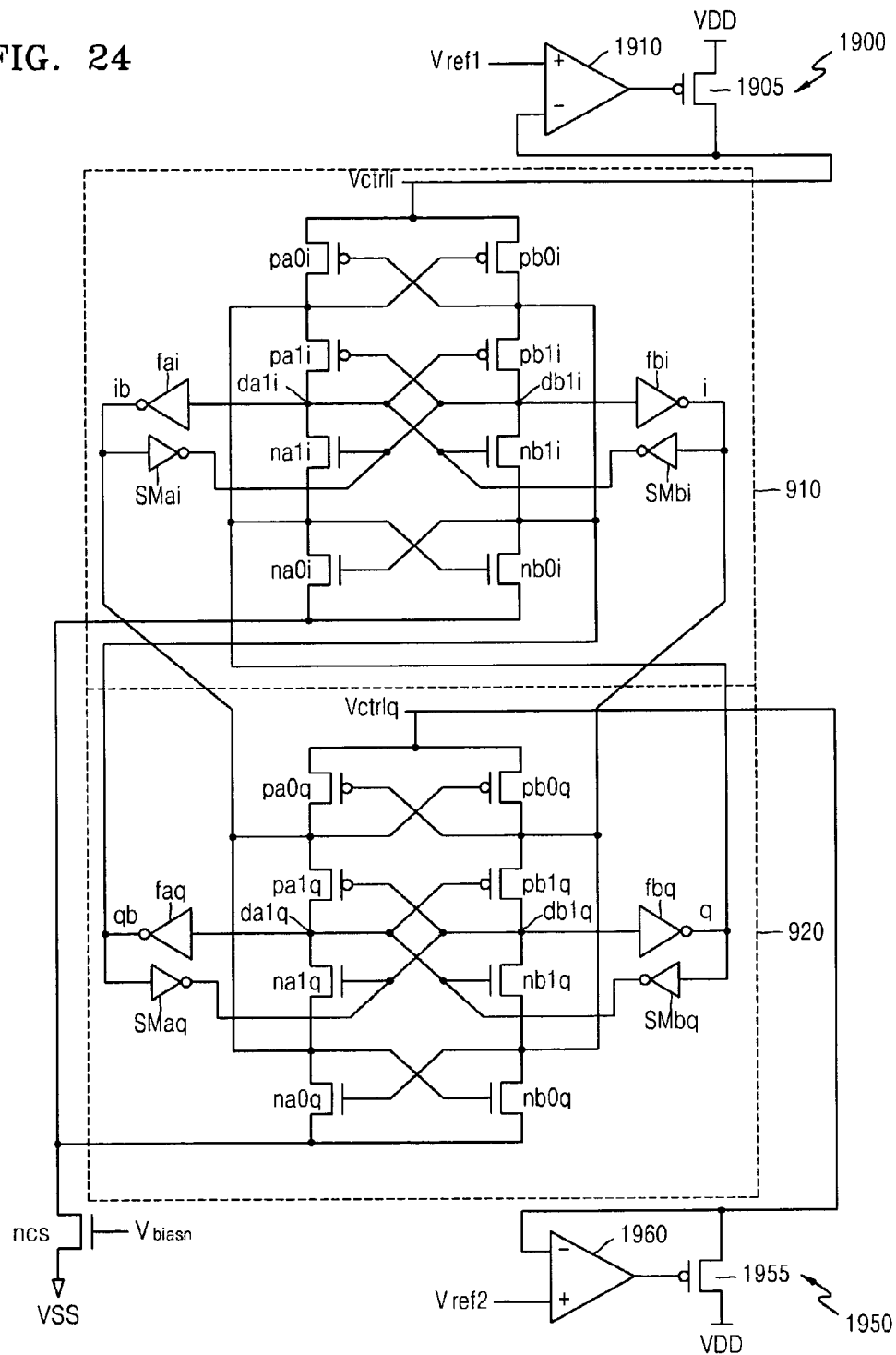
Figure 25:
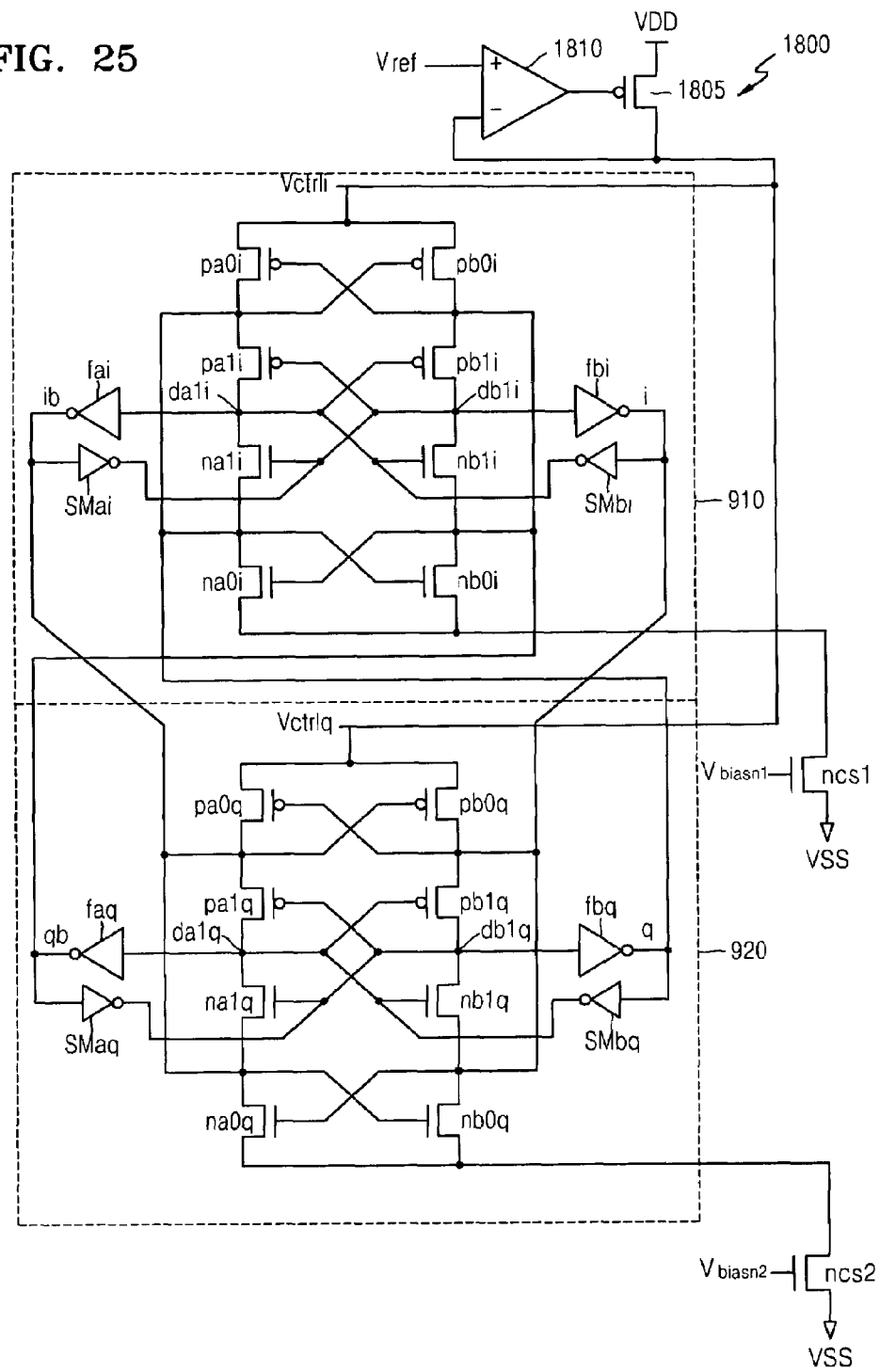

FIGS. 22-25 illustrate other embodiments of an oscillator. FIG. 22 illustrates a combination of the embodiments of FIGS. 18 and 20. FIG. 23 illustrates a combination of the embodiments of FIGS. 19 and 21. FIG. 24 illustrates a combination of the embodiment of FIGS. 19 and 20. FIG. 25 illustrates a combination of the embodiments of FIGS. 18 and 21. The operation of these embodiments will be readily apparent from the description of the embodiments of FIGS. 18-21 above.

FIGS. 26-32 illustrate implantation embodiments.

Figure 26:
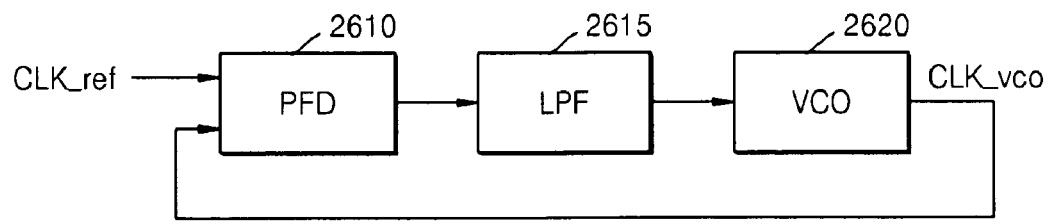
FIGS. 26-33 illustrate example embodiments of applications of the oscillator.

FIG. 26 illustrates a block diagram of a phased-locked loop circuit (PLL). As shown, the PLL includes a phase detector 2610 detecting a phase difference between a reference clock signal CLK_ref and a voltage controlled clock signal CLK_vco. The phase detector 2610 outputs a voltage indicative of the detected phase difference. A low pass filter 2615 filters the voltage output from the phase detector 2610. A voltage controlled oscillator 2620 receives the filtered voltage, and generates the voltage controlled clock CLK_vco based on the filtered voltage. The voltage controlled oscillator 2620 may be any of the oscillator embodiments described above. For example, the voltage controlled oscillator 2620 may be the embodiment of FIG. 5, where the filtered voltage is supplied as the control voltage Vctrl and the oscillation signal i is the voltage controlled clock signal CLK_vco.

Figure 27:
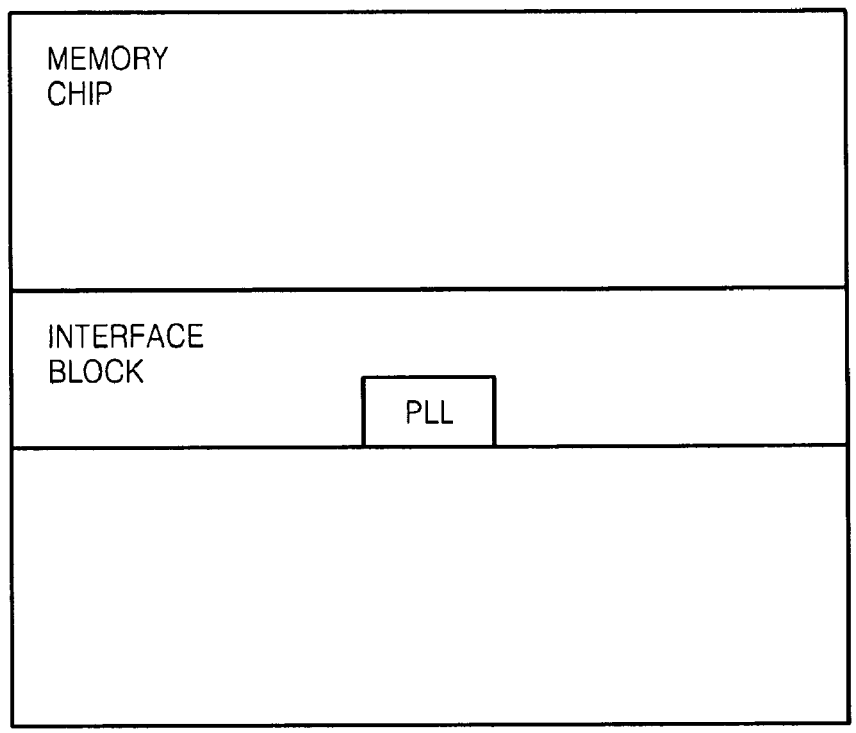

PLLs are widely used in the high-speed interface block for a memory chip. For example, the PLL may be used as a clock generator in the high speed interface block. The use of a PLL in this fashion is shown in FIG. 27. The PLL of this embodiment may be the PLL described above with respect to FIG. 26.

Figure 28:
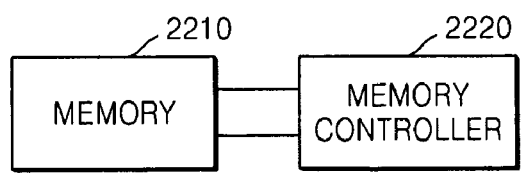

FIG. 28 illustrates an example embodiment of an application of the semiconductor device. As shown, this embodiment includes a memory 2210 connected to a memory controller 2220. The memory 2210 may be any memory that employs an oscillator, and the oscillator may be any of the above-described embodiments suitable for the particular memory. The memory controller 2220 supplies the input signals for controlling operation of the memory 2210. For example, the memory controller 2220 supplies the command CMD and address signals.

Figure 29:
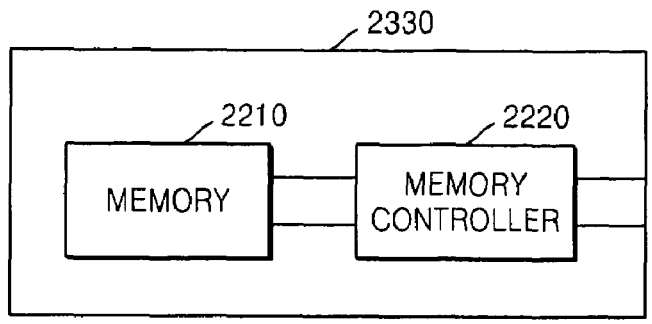

FIG. 29 illustrates yet another embodiment. This embodiment is the same as the embodiment of FIG. 28, except that the memory 2210 and memory controller 2220 have been embodied as a card 2330. For example, the card 2330 may be a memory card such as a flash memory card. Namely, the card 2330 may be a card meeting any industry standard for use with a consumer electronics device such as a digital camera, personal computer, etc. It will be appreciated that the memory controller 2220 may control the memory 2210 based on controls signals received by the card 2330 from another (e.g., external) device.

Figure 30:
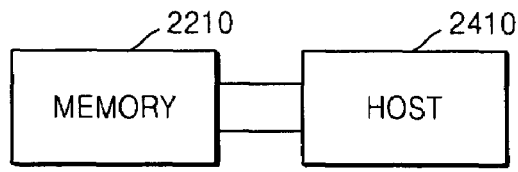

FIG. 30 illustrates a still further implementation embodiment. As shown, the memory 2210 may be connected with a host system 2410. The host system 2410 may be a processing system such as a personal computer, digital camera, etc. The host system 2410 may use the memory 2210 as a removable storage medium. As will be appreciated, the host system 2410 supplies the input signals for controlling operation of the memory 2210. For example, the host system 2410 supplies the command CMD and address signals.

Figure 31:
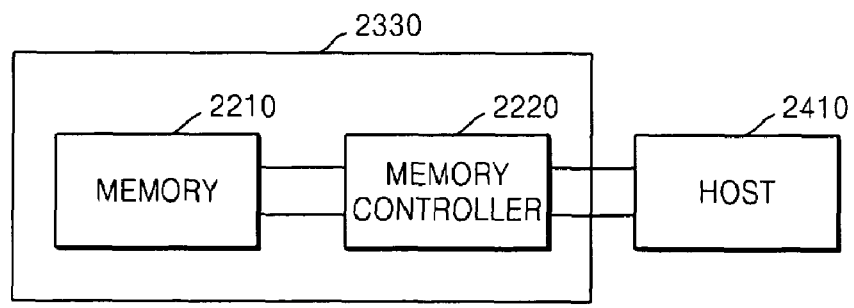

FIG. 31 illustrates an embodiment in which the host system 2410 is connected to the card 2330 of FIG. 29. In this embodiment, the host system 2410 applies control signals to the card 2330 such that the memory controller 2220 controls operation of the memory 2210.

Figure 32:
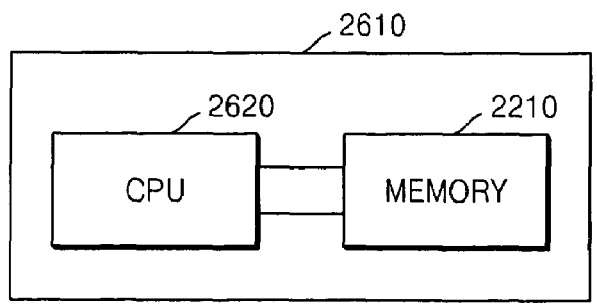

FIG. 32 illustrates a further implementation embodiment. As shown, the memory 2210 may be connected to a central processing unit (CPU) 2620 within a computer system 2610. For example, the computer system 2610 may be a personal computer, personal data assistant, etc. The memory 2210 may be directly connected with the CPU 2620, connected via bus, etc. It will be appreciated, that FIG. 32 does not illustrate the full complement of components that may be included within a computer system 2610 for the sake of clarity.

Figure 33:
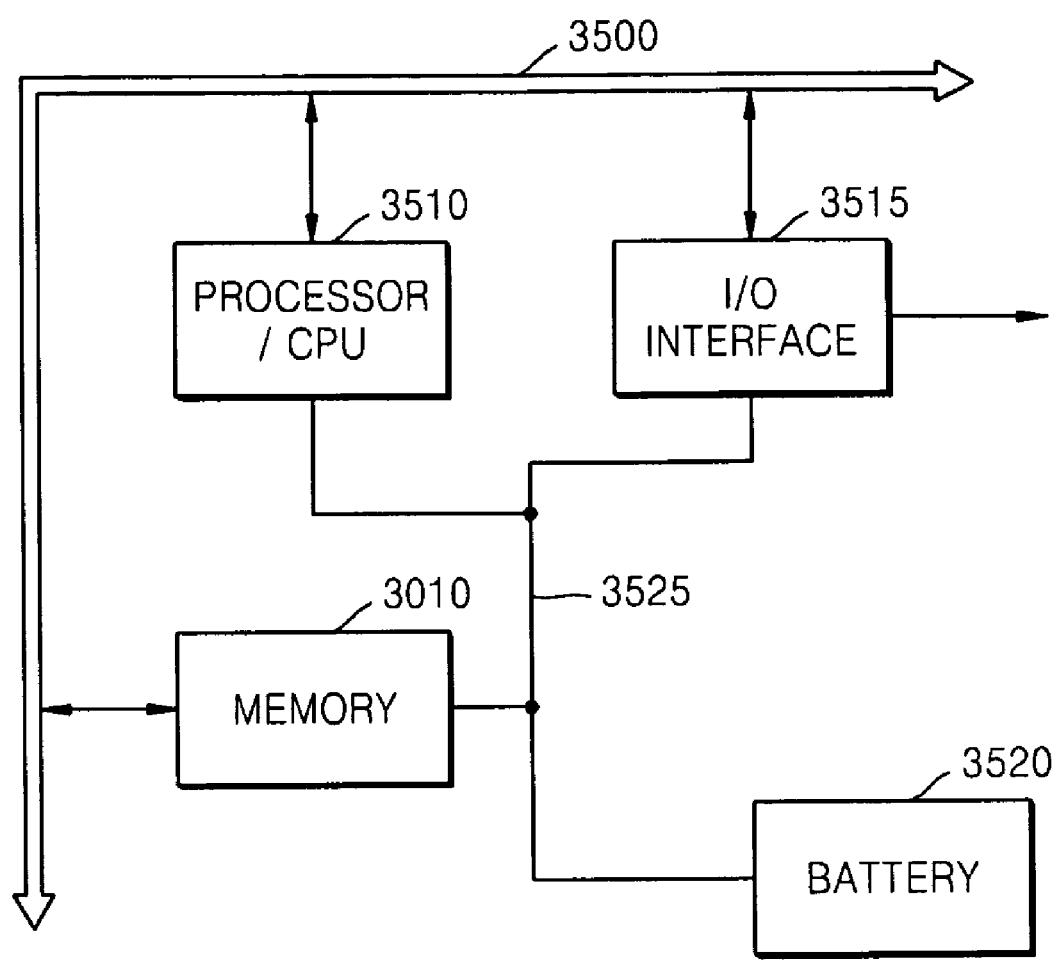

FIG. 33 illustrates another embodiment of the present invention. FIG. 33 may represent another portable application of the semiconductor device embodiments described above. As shown, this embodiment includes the memory 3010, which may be any of the semiconductor device embodiments described above. In this and any of the previous embodiments, the memory 3010 may include one or more integrated circuit dies where each die has a memory array that operates according to the various embodiments. These IC dies may be separate, stand alone memory devices that are arranged in modules such as conventional dynamic random access memory (DRAM) modules, or they may be integrated with other on-chip functionalities. In the latter embodiments, the memory 3010 may be part of an I/O processor or a microcontroller as described above.

This and the other portable application embodiments may be for instance a portable notebook computer, a digital still and/or video camera, a personal digital assistant, a mobile (cellular) hand-held telephone unit, navigation device, GPS system, audio and/or video player, etc. Of course, there are other non-portable applications for the memory 3010. These include, for instance, large network servers or other computing devices which may benefit from a non-volatile memory device.

As shown in FIG. 33, this embodiment includes a processor or CPU 3510 that uses the memory 3010 as program memory to store code and data for its execution. Alternatively, the memory 3010 may be used as a mass storage device for non-volatile storage of code and data. The portable application embodiment may communicate with other devices, such as a personal computer or a network of computers via an I/O interface 3515. This I/O interface 3515 may provide access to a computer peripheral bus, a high speed digital communication transmission line, or an antenna for unguided transmissions. Communications between the processor and the memory 3010 and between the processor 3510 and the I/O interface 3515 may be accomplished using conventional computer bus architectures as represented by bus 3500 in FIG. 33. Furthermore, the present invention is not limited to this architecture. For example, the memory 3010 may be replaced with the embodiment of FIG. 29, and communication with the processor 3510 may be via the memory controller 3020. Furthermore, the I/O interface 3515 may communicate with the memory 3010 via the memory controller 3020, or directly with the memory 3010 if the memory controller 3020 is not present. In portable applications, the above-described components are powered by a battery 3520 via a power supply bus 3525.

The invention being thus described, it will be obvious that the same may be varied in many ways. Such variations are not to be regarded as a departure from the invention, and all such modifications are intended to be included within the scope of the invention.

We claim:

1. An oscillator, comprising:
a first starved inverter;
a second starved inverter, an inner inverter of the second starved inverter being cross-coupled to an inner inverter of the first starved inverter, the inner inverter of the first starved inverter and the inner inverter of the second starved inverter each including at least two transistors;
a first inverter connected to output of the inner inverter of the first starved inverter;
an output of the first inverter being supplied to an input of an outer inverter of the second starved inverter, the outer inverter of the second starved inverter including at least two transistors;
a second inverter connected to output of the inner inverter of the second starved inverter, and
an output of the second inverter being supplied to an input of an outer inverter of the first starved inverter, the outer inverter of the first starved inverter including at least two transistors.

2. The oscillator of claim 1, wherein a phase difference between the output of the first inverter and the output of the second inverter is 180 degrees.

3. The oscillator of claim 2, wherein
the first starved inverter is connected between a high voltage and a low voltage; and
the second starved inverter is connected between the high voltage and the low voltage.

4. The oscillator of claim 3, further comprising:
a voltage supply circuit configured to supply the high voltage.

5. The oscillator of claim 4, wherein the voltage supply circuit is configured to change an oscillating frequency of the oscillator by changing the high voltage.

6. The oscillator of claim 3, further comprising:
a transistor connected between the low voltage and the first starved inverter, and the transistor connected between the low voltage and the second starved inverter.

7. The oscillator of claim 6, wherein the transistor is configured to change an oscillating frequency of the oscillator based on a bias applied to a gate of the transistor.

8. The oscillator of claim 1, further comprising:
a third inverter connected between output of the first inverter and input of the inner inverter of the first starved inverter, the third inverter being smaller than the first and second inverters;
a fourth inverter connected between output of the second inverter and input of the inner inverter of the second starved inverter, the fourth inverter being smaller than the first and second inverters.

9. A oscillator comprising:
a first and a second stage;
the first stage including at least a pair of cross-coupled starved inverters, each starved inverter including an inner inverter and an outer inverter, each inner inverter and outer inverter each including at least two transistors;
the second stage including at least one inverter inverting output of one of the cross-coupled starved inverters.

10. The oscillator of claim 9, wherein the first stage is configured to selectively leak current to an input of one of the cross-coupled inverters to change an output state of the one of the cross-coupled inverters.

11. The oscillator of claim 9, wherein the first stage is configured to selectively leak current away from one of the cross-coupled inverters to change an output state of the one of the cross-coupled inverters.

12. The oscillator of claim 9, wherein the first stage is configured to selectively leak current to an input of a first one of the cross-coupled inverters to change an output state of the first one of the cross-coupled inverters while leaking current from an input of a second one of the cross-coupled inverters to change an output state of the second one of the cross-coupled inverters.

13. The oscillator of claim 12, wherein the first stage is configured such that current is not leaked to the Input of the second one of the cross-coupled inverters if current is being leaked away from the second one of the cross-coupled inverters, and the first stage is configured such that current is not leaked away from the first one of the cross-coupled inverters if current is being leaked to the input of the first one of the cross-coupled inverters.

14. The oscillator of claim 12, wherein the first stage is configured, after the first and second cross-coupled inverters change state, to leak current from the input of a first one of the cross-coupled inverters to change the output state of the first one of the cross-coupled inverters while leaking current to the input of the second one of the cross-coupled inverters to change the output state of the second one of the cross-coupled inverters.

15. The oscillator of claim 14, wherein the second stage comprises:
a first inverter inverting output from the first one of the cross-coupled inverters; and
a second inverter inverting output from the second one of the cross-coupled inverters.

16. The oscillator of claim 9, wherein the second stage comprises:
   a first inverter inverting output from a first one of the cross-coupled inverters; and
   a second inverter inverting output from a second one of the cross-coupled inverters.

17. The oscillator of claim 16, wherein the second stage comprises:
   a third inverter connected between output of the first inverter and input of the first one of the cross-coupled inverters, the third inverter being smaller than the first and second inverters;
   a fourth inverter connected between output of the second inverter and input of the second one of the cross-coupled inverters, the fourth inverter being smaller than the first and second inverters.

18. The oscillator of claim 9, wherein the first and second stages are the only stages.

19. An oscillator comprising:
   a first oscillating circuit, the first oscillating circuit including,
   a first and a second stage;
   the first stage including at least a pair of cross-coupled starved inverters each including an inner inverter and an outer inverter, each inner inverter and outer inverter of the first stage including at least two transistors;
   the second stage including at least one inverter connected to an output of one of the cross-coupled inverters; and
   a second oscillating circuit, the second oscillating circuit including,
   a third and fourth stage,
   the third stage including at least a pair of cross-coupled starved inverters each including an inner inverter and an outer inverter, and receiving output from the inverter of the second stage, each inner inverter and outer inverter of the third stage including at least two transistors;
   the fourth stage including at least one inverter connected to an output of one of the cross-coupled inverters, and supplying output to the first stage.

* * * * *